US012132455B2

(12) United States Patent
Kao et al.

(10) Patent No.: US 12,132,455 B2
(45) Date of Patent: Oct. 29, 2024

(54) AMPLIFIER WITH SWITCHABLE TRANSFORMER

(71) Applicant: QUALCOMM Incorporated, San Diego, CA (US)

(72) Inventors: Te Yu Kao, Hsinchu (TW); Muhammad Hassan, San Diego, CA (US); Abdellatif Bellaouar, Richardson, TX (US)

(73) Assignee: QUALCOMM Incorporated, San Diego, CA (US)

( * ) Notice: Subject to any disclaimer, the term of this patent is extended or adjusted under 35 U.S.C. 154(b) by 488 days.

(21) Appl. No.: 17/647,534

(22) Filed: Jan. 10, 2022

(65) Prior Publication Data

US 2022/0231642 A1     Jul. 21, 2022

Related U.S. Application Data

(60) Provisional application No. 63/139,259, filed on Jan. 19, 2021.

(51) Int. Cl.
H03F 9/00     (2006.01)
H03F 3/24     (2006.01)

(52) U.S. Cl.
CPC ....... *H03F 3/245* (2013.01); *H03F 2200/451* (2013.01); *H03F 2200/537* (2013.01)

(58) Field of Classification Search
CPC .......................................................... H03F 9/00
USPC ................................................. 330/165, 276
See application file for complete search history.

(56) References Cited

U.S. PATENT DOCUMENTS

| | | | | |
|---|---|---|---|---|
| 4,191,929 A | * | 3/1980 | Max | H03F 3/393 330/10 |
| 5,986,617 A | | 11/1999 | McLellan | |
| 7,425,869 B2 | * | 9/2008 | Aoki | H03F 3/604 330/276 |
| 7,872,528 B2 | * | 1/2011 | Bockelman | H03F 3/45475 330/149 |
| 8,929,945 B1 | * | 1/2015 | Wei | H04B 1/0057 330/195 |
| 10,581,389 B1 | | 3/2020 | Balteanu et al. | |
| 2012/0009889 A1 | | 1/2012 | Morgan et al. | |

(Continued)

FOREIGN PATENT DOCUMENTS

WO      2020005231 A1     1/2020

OTHER PUBLICATIONS

International Search Report and Written Opinion—PCT/US2022/012010—ISA/EPO—Apr. 19, 2022.

(Continued)

*Primary Examiner* — Henry Choe
(74) *Attorney, Agent, or Firm* — Loza & Loza

(57) ABSTRACT

In certain aspects, an apparatus includes a first amplifier having a first output and a second output, and a transformer. The transformer includes a first switchable inductor coupled between the first output and the second output, a first capacitor coupled in parallel with the first switchable inductor, a second switchable inductor magnetically coupled to the first switchable inductor, a second capacitor coupled in parallel with the second switchable inductor, a third switchable inductor magnetically coupled to the first switchable inductor, and a third capacitor coupled in parallel with the third switchable inductor.

28 Claims, 17 Drawing Sheets

(56) References Cited

U.S. PATENT DOCUMENTS

2015/0194944 A1     7/2015   Joshi et al.
2016/0126983 A1     5/2016   Komijani et al.

OTHER PUBLICATIONS

Lee, Y., et al., "A Dual-Power-Mode Output Matching Network for Digitally Modulated CMOS Power Amplifier", IEEE Transactions on Microwave Theory and Techniques, IEEE, USA, vol. 61, No. 4, Apr. 1, 2013 (Apr. 1, 2013), XP011498915, pp. 1570-1579, ISSN: 0018-9480, DOI: 10.1109/TMTT.2013.2246525 Paragraph [0001]—Paragraph [000V], Figures 1-24.

* cited by examiner

AMPLIFIER WITH SWITCHABLE TRANSFORMER

CROSS-REFERENCE TO RELATED APPLICATION

This application claims priority to and the benefit of Provisional Patent Application No. 63/139,259, filed in the United States Patent and Trademark Office on Jan. 19, 2021, the entire specification of which is incorporate herein as if fully set forth below in its entirety and for all applicable purposes.

BACKGROUND

Field

Aspects of the present disclosure relate generally to wireless communications, and, more particularly, to an amplifier with a switchable transformer.

Background

A wireless device includes a transmitter for transmitting signals via one or more antennas. The transmitter may include multiple amplifiers to amplify signals before the signals are transmitted. The amplifiers may include variable gain amplifiers (VGAs), driver amplifiers, and power amplifiers (PAs). A transformer may be used as a load of an amplifier to implement a bandpass filter for amplifying signals within a desired frequency band. A transformer may also be used in the transmitter to convert a differential signal into a single-ended signal, convert a single-ended signal into a differential signal, and/or provide impedance matching.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an apparatus. The apparatus includes a first amplifier having a first output and a second output, and a transformer. The transformer includes a first switchable inductor coupled between the first output and the second output, a first capacitor coupled in parallel with the first switchable inductor, a second switchable inductor magnetically coupled to the first switchable inductor, a second capacitor coupled in parallel with the second switchable inductor, a third switchable inductor magnetically coupled to the first switchable inductor, and a third capacitor coupled in parallel with the third switchable inductor.

A second aspect relates to a method for operating an apparatus. The apparatus includes a first amplifier, and a transformer including a first switchable inductor coupled to the first amplifier, a second switchable inductor magnetically coupled to the first switchable inductor, and a third switchable inductor magnetically coupled to the first switchable inductor. The method includes, in a first mode, switching the first switchable inductor to a first inductance, enabling the second switchable inductor, and disabling the third switchable inductor. The method also includes, in a second mode, switching the first switchable inductor to a second inductance, disabling the second switchable inductor, and enabling the third switchable inductor.

A third aspect relates to an apparatus. The apparatus includes a first amplifier having a first output and a second output, and a transformer. The transformer includes at least one first inductor, at least one second inductor, wherein the at least one first inductor and the at least one second inductor are coupled between the first output and the second output of the first amplifier, and at least one first switch coupled in parallel with the at least one second inductor. The transformer also includes at least one third inductor magnetically coupled to the at least one first inductor and the at least one second inductor, at least one second switch coupled in series with the at least one third inductor, and a second capacitor coupled in parallel with the at least one second inductor and the at least one second switch. The transformer further includes at least one fourth inductor magnetically coupled to the at least one first inductor, at least one third switch coupled in series with the at least one fourth inductor, and a third capacitor coupled in parallel with the at least one fourth inductor and the at least one third switch.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
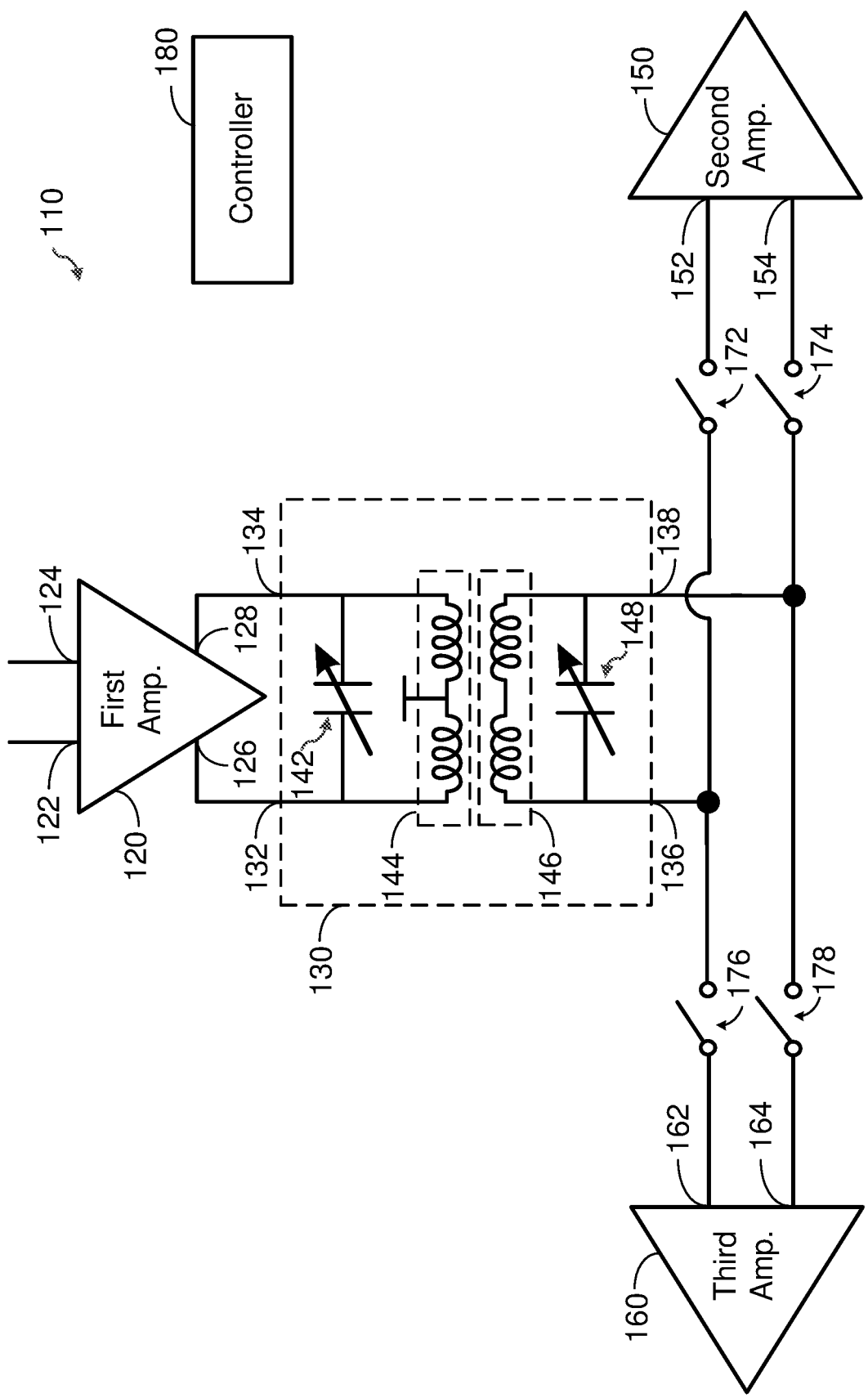
FIG. 1 shows an example of an amplifier with a transformer according to certain aspects of the present disclosure.

FIG. 1 shows an example of a system 110 in a transmitter according to certain aspects of the present disclosure. The system 110 is configured to amplify signals before the signals are transmitted via one or more antennas (not shown) coupled to the transmitter. In one example, the system 110 receives intermediate frequency (IF) signals from a previous stage (not shown) that converts baseband signals from a baseband processor into the IF signals. In this example, the system 110 amplifies the IF signals and outputs the amplified IF signals to a subsequent stage (not shown) that frequency upconverts the amplified IF signals into radio frequency (RF) signals for transmission. The IF signals may have frequencies in the gigahertz range. In other implementations, the system 110 may amplify RF signals.

In certain aspects, the system 110 is configured to amplify signals (e.g., IF signals) in multiple frequency bands. The multiple frequency bands may be used for different wireless communication technologies supported by the transmitter or may be used for the same wireless communication technology. In one example, the system 110 is configured to amplify signals in a first frequency band and signals in a second frequency band. The first frequency band and the second frequency band may be contiguous or non-contiguous.

In the example in FIG. 1, the system 110 includes a first amplifier 120, a transformer 130, a second amplifier 150, and a third amplifier 160. In one example, the first amplifier 120 is used to amplify signals in both the first frequency band and the second frequency band, the second amplifier 150 is used to amplify signals in the first frequency band, and the third amplifier 160 is used to amplify signals in the second frequency band. As discussed further below, the transformer 130 is used as a load for the first amplifier 120 to implement a bandpass filter having a wide passband covering both the first frequency band and the second frequency band.

In this example, the first amplifier 120 is a differential amplifier having a differential input and a differential output, in which the differential input includes a first input 122 and a second input 124, and the differential output includes a first output 126 and a second output 128. The outputs 126 and 128 of the first amplifier 120 are coupled to a primary side of the transformer 130 where the transformer 130 provides a load for the first amplifier 120. In this example, the first amplifier 120 is configured to receive differential signals (e.g., differential IF signals) in both the first frequency band and the second frequency band from the previous stage (not shown) and drive the primary side of the transformer 130 based on the received differential signals. An exemplary implementation of the first amplifier 120 is discussed below with reference to FIG. 2.

The second amplifier 150 has a differential input including a first input 152 and a second input 154. In the example shown in FIG. 1, the system 110 includes a first switch 172 coupled between the first input 152 of the second amplifier 150 and a secondary side of the transformer 130, and a second switch 174 coupled between the second input 154 of the second amplifier 150 and the secondary side of the transformer 130. As discussed further below, the second amplifier 150 is configured to amplify signals in the first frequency band in a first mode and output the amplified signals in the first frequency band to a subsequent stage (e.g., a first mixer for frequency upconversion to RF).

The third amplifier 160 has a differential input including a first input 162 and a second input 164. The system 110 includes a third switch 176 coupled between the first input 162 of the third amplifier 160 and the secondary side of the transformer 130, and a fourth switch 178 coupled between the second input 164 of the third amplifier 160 and the secondary side of the transformer 130. As discussed further below, the third amplifier 160 is configured to amplify signals in the second frequency band in a second mode and output the amplified signals in the second frequency band to a subsequent stage (e.g., a second mixer for frequency upconversion to RF). Thus, in this example, signals in both frequency bands are amplified by the first amplifier 120, signals in the first frequency band are further amplified by the second amplifier 150, and signals in the second frequency band are further amplified by the third amplifier 160.

In the first mode, a controller 180 turns on (i.e., closes) the first switch 172 and the second switch 174, and turns off (i.e., opens) the third switch 176 and the fourth switch 178. Thus, in the first mode, the differential input of the second amplifier 150 is coupled to the secondary side of the transformer 130 to amplify signals in the first frequency band. In the second mode, the controller 180 turns on (i.e., closes) the third switch 176 and the fourth switch 178, and turns off (i.e., opens) the first switch 172 and the second switch 174. Thus, in the second mode, the differential input of the third amplifier 160 is coupled to the secondary side of the transformer 130 to amplify signals in the second frequency band. Note that the individual connections between the controller 180 and the switches 172, 174, 176, and 178 are not shown in FIG. 1 for ease of illustration.

In the example in FIG. 1, the primary side of the transformer 130 includes a first inductor 144 and a first capacitor 142 coupled in parallel between a first terminal 132 and a second terminal 134 of the transformer 130. The secondary side of the transformer 130 includes a second inductor 146 and a second capacitor 148 coupled in parallel between a third terminal 136 and a fourth terminal 138 of the transformer 130. The first inductor 144 and the second inductor 146 are magnetically coupled (i.e., inductively coupled). The magnetic coupling transfers signal power from the primary side to the secondary side of the transformer 130.

In this example, the differential output of the first amplifier 120 is coupled to the primary side of the transformer 130. More particularly, the first output 126 of the first amplifier 120 is coupled to the first terminal 132 of the transformer 130 and the second output 128 of the first amplifier 120 is coupled to the second terminal 134 of the transformer 130.

In this example, the first switch 172 is coupled between the first input 152 of the second amplifier 150 and the third terminal 136 of the transformer 130, and the second switch 174 is coupled between the second input 154 of the second amplifier 150 and the fourth terminal 138 of the transformer 130.

In this example, the third switch 176 is coupled between the first input 162 of the third amplifier 160 and the third terminal 136 of the transformer 130, and the fourth switch 178 is coupled between the second input 164 of the third amplifier 160 and the fourth terminal 138 of the transformer 130.

Figure 2:
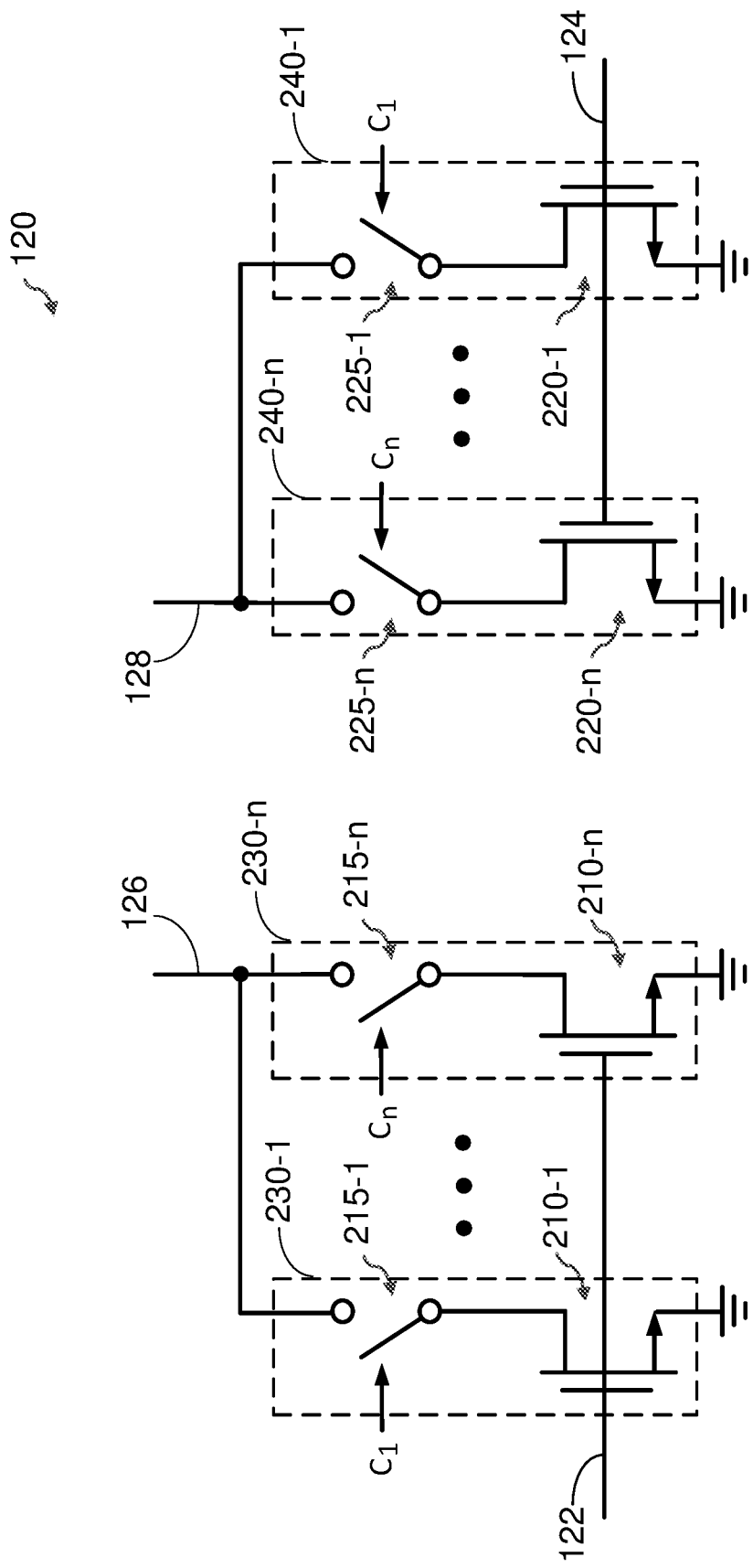
FIG. 2 shows an exemplary implementation of an amplifier according to certain aspects of the present disclosure.

As discussed above, the first amplifier 120 drives the primary side of the transformer 130 based on differential signals (e.g., differential IF signals) received at the differential input of the first amplifier 120 from the previous stage (not shown). In this regard, FIG. 2 shows an exemplary implementation of the first amplifier 120 according to certain aspects. In this example, the first amplifier 120 is a variable gain amplifier.

In the example in FIG. 2, the first amplifier 120 includes a first set of branches 230-1 to 230-n coupled between the first output 126 and ground, and a second set of branches 240-1 to 240-n coupled between the second output 128 and ground. Each branch in the first set of branches 230-1 to 230-n includes a respective input transistor 210-1 to 210-n and a respective switch 215-1 to 215-n. In each branch in the first set of branches 230-1 to 230-n, the gate of the respective input transistor 210-1 to 210-n (e.g., NFET) is coupled to the first input 122, and the respective switch 215-1 to 215-n is coupled between the respective input transistor 210-1 to 210-n and the first output 126. Each branch in the second set of branches 240-1 to 240-n includes a respective input transistor 220-1 to 220-n and a respective switch 225-1 to 225-n. In each branch in the second set of branches 240-1 to 240-n, the gate of the respective input transistor 220-1 to 220-n (e.g., NFET) is coupled to the second input 124, and the respective switch 225-1 to 225-n is coupled between the respective input transistor 220-1 to 220-n and the second output 128.

In this example, a gain controller (not shown) controls the gain of the first amplifier 120 by controlling the number of the branches 230-1 to 230-n and 240-1 to 240-n that are enabled using control signals $C_1$ to $C_n$. The larger the number of branches that are enabled, the higher the gain. The gain controller enables a branch by closing the respective switch (e.g., respective one of the switches 215-1 to 215-n and 225-1 to 225-n) and disables a branch by opening the respective switch. In operation, the input transistor in each enabled branch in the first set of branches 230-1 to 230-n drives the first output 126 based on the voltage at the first input 122. The input transistor in each enabled branch in the second set of branches 240-1 to 240-n drives the second output 128 based on the voltage at the second input 124. Each of the switches 215-1 to 215-n and 225-1 to 225-n may be implemented with an NFET, a PFET, a transmission gate, or another type of switch.

It is to be appreciated that the first amplifier 120 is not limited to the exemplary implementation shown in FIG. 2.

Returning to FIG. 1, the transformer 130 implements a bandpass filter that causes the first amplifier 120 to amplify signals within a desired passband. The passband is a function of the primary resonance frequency of the transformer 130, the secondary resonance frequency of the transformer 130, and the coupling factor K between the first inductor 144 and the second inductor 146. The coupling factor K is a measure of the magnetic coupling between the first inductor 144 and the second inductor 146, as discussed further below.

The primary resonance frequency is given by the following:

$$fr_1 = \frac{1}{2\pi\sqrt{C_1 L_1}} \quad (1)$$

where $fr_1$ is the primary resonance frequency, $C_1$ is the capacitance of the first capacitor 142, and $L_1$ is the inductance of the first inductor 144. $C_1$ may also include parasitic capacitance at the outputs 126 and 128 of the first amplifier 120. As shown in equation (1), the primary resonance frequency can be set to a desired frequency by choosing the capacitance of the first capacitor 142 and the inductance of the first inductor 144 accordingly. The secondary resonance frequency is given by the following:

$$fr_2 = \frac{1}{2\pi\sqrt{C_2 L_2}} \quad (2)$$

where $fr_2$ is the secondary resonance frequency, $C_2$ is the capacitance of the second capacitor 148, and $L_2$ is the inductance of the second inductor 146. $C_2$ may also include parasitic capacitance at the inputs 152 and 154 of the second amplifier 150 and/or the inputs 162 and 164 of the third amplifier 160. As shown in equation (2), the secondary resonance frequency can be set to a desired frequency by choosing the capacitance of the second capacitor 148 and the inductance of the second inductor 146 accordingly.

The coupling factor K depends on the overlap between the first inductor 144 and the second inductor 146. For example, the first inductor 144 and the second inductor 146 may be integrated on a chip in which the first inductor 144 is implemented with a first planar loop inductor and the second inductor 146 is implemented with a second planar loop inductor on the chip. In this example, the first inductor 144 and the second inductor 146 are formed in different layers of the chip with the first inductor 144 overlapping the second inductor 146 to magnetically couple the first inductor 144 and the second inductor 146. In this example, the coupling factor K is a function of the overlap between the first inductor 144 and the second inductor 146, where the coupling factor K is larger for a larger overlap. Thus, the coupling factor K may be set to a desired value by laying out the first inductor 144 and the second inductor 146 on the chip such that the overlap between the first inductor 144 and the second inductor 146 corresponds to the desired coupling factor K.

As discussed above, the passband of the transformer 130 is a function of the primary resonance frequency, the secondary resonance frequency, and the coupling factor K. In one example, the center frequency of the passband is a function of the primary resonance frequency and the secondary resonance frequency of the transformer 130. In this example, the primary resonance frequency and the secondary resonance frequency may each be set to a frequency approximately equal to the desired center frequency for the passband. As discussed above, the primary resonance frequency is set by the capacitance of the first capacitor 142 and the inductance of the first inductor 144, and the secondary resonance frequency is set by the capacitance of the second capacitor 148 and the inductance of the second inductor 146.

In the above example, the bandwidth of the passband (i.e., the width of the passband in frequency) is a function of the coupling factor K. Thus, the passband may be set to a desired bandwidth by setting the coupling factor K accordingly. As discussed above, the coupling factor K may be set by the overlap between the first inductor 144 and the second inductor 146.

Figure 3:
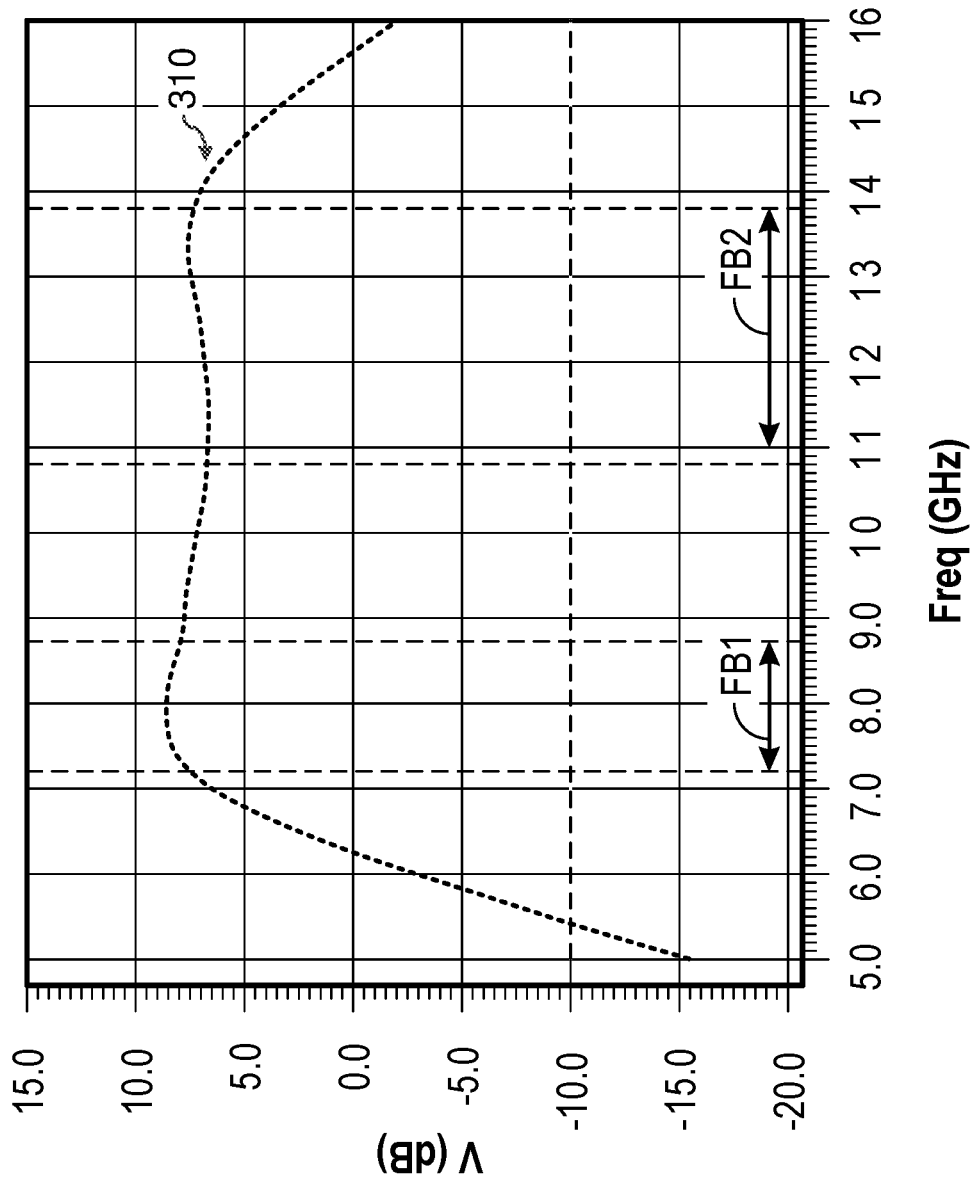
FIG. 3 shows an example in which the transformer provides a wideband frequency response covering multiple frequency bands according to certain aspects of the present disclosure.

As discussed above, the first amplifier 120 is used to amplify signals in both the first frequency band and the second frequency band. In this regard, the primary resonance frequency, the secondary resonance frequency, and the coupling factor K are chosen to provide the transformer 130 with a wide passband covering both the first frequency band and the second frequency band. An example of this is illustrated in FIG. 3, which shows an exemplary passband 310 of the transformer 130. In this example, the passband 310 has a wide bandwidth covering both the first frequency band (labeled "FB1") and the second frequency band (labeled "FB2"). This allows the first amplifier 120 to provide high gain for both frequency bands.

In the example shown in FIG. 3, the first frequency band spans approximately 7.2 GHz to 8.7 GHz and the second frequency band spans approximately 10.8 GHz to 13.8 GHz. Thus, in this example, the passband 310 spans 7.2 GHz to 13.8 GHz to cover both frequency bands. However, it is to be appreciated that the first frequency band and the second frequency band are not limited to the above frequencies.

In some applications, the system 110 is used to amplify signals in one of the first frequency band and the second frequency band at a time. For example, in the first mode, the system 110 is used to amplify signals in the first frequency band, and, in the second mode, the system 110 is used to amplify signals in the second frequency band. In these applications, maintaining a wide passband that covers both frequency bands reduces the power efficiency of the first amplifier 120. This is because only a portion of the wide passband is needed at a time since the first amplifier 120 amplifies signals in one of the frequency bands at a time. As a result, the wide passband causes the first amplifier 120 to consume power maintaining high gain for the frequency band that is not being used at a given time. The power efficiency is further reduced for the case where the first frequency band and the second frequency band are non-contiguous, as shown in the example in FIG. 3. This is because the wide passband covers frequencies in the frequency gap between the first frequency band and the second frequency band which causes the first amplifier 120 to consume power providing high gain within the frequency gap.

Aspects of the present disclosure increase the power efficiency of the first amplifier 120 by providing a switchable transformer configured to switch between a first passband and a second passband. In one example, the first passband covers the first frequency band and the second passband covers the second frequency band. In this example, each of the first and second passbands has a narrower bandwidth than the wide passband discussed above. In operation, a controller switches the switchable transformer to the first passband when the first frequency band is being used and switches the switchable transformer to the second passband when the second frequency band is being used. Thus, the controller switches the switchable transformer to one of the first and second passbands at a time depending on which of the first and second frequency bands is being used. Since one of the first and second passbands is used at a time and each of the first and second passbands has a narrower bandwidth than the wide passband discussed above, the power consumption of the first amplifier 120 is reduced, thereby increasing power efficiency.

Figure 4A:
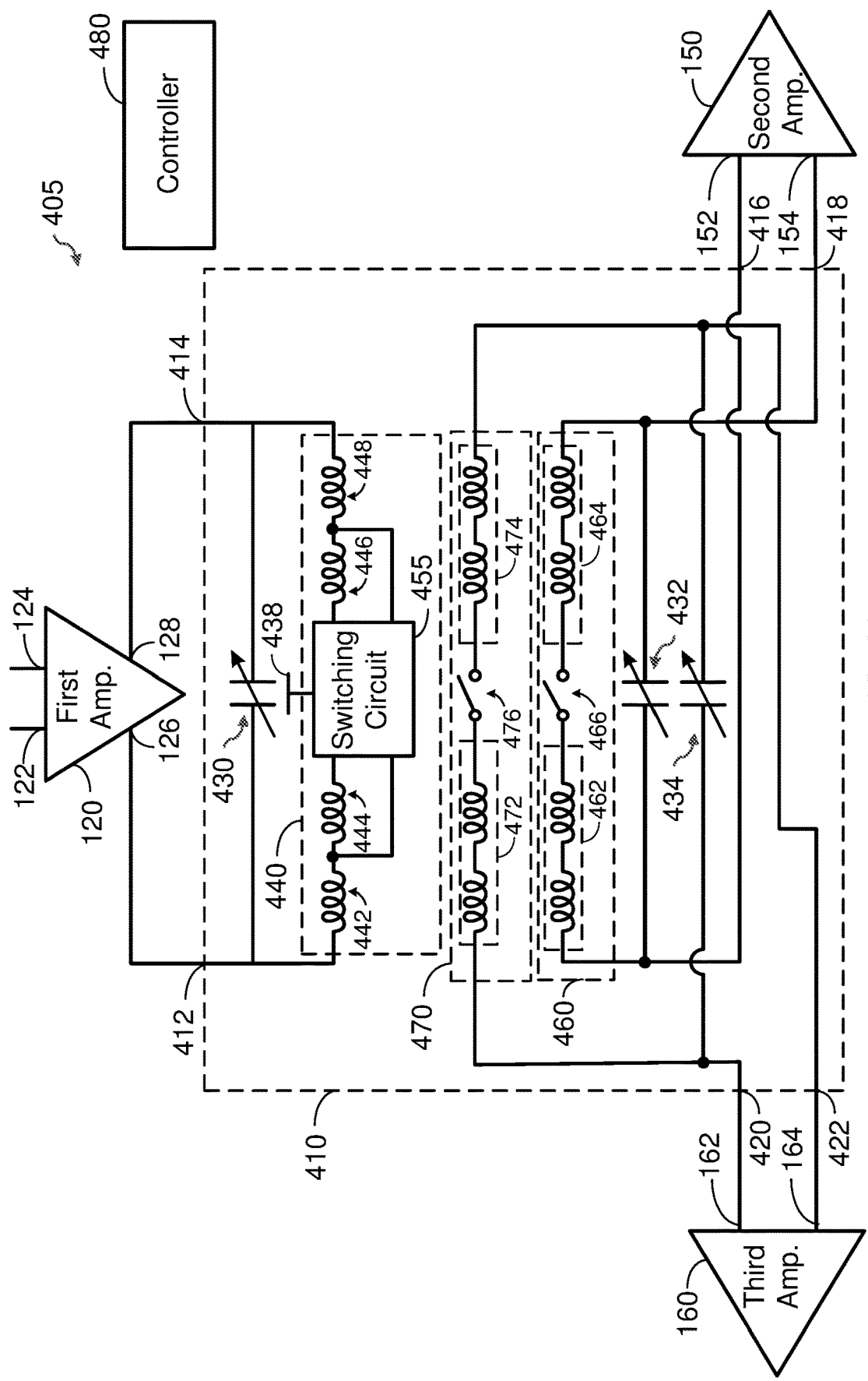
FIG. 4A shows an example of an amplifier with a switchable transformer according to certain aspects of the present disclosure.

FIG. 4A shows an example of a system 405 in a transmitter according to certain aspects of the present disclosure. The system 405 is configured to amplify signals before the signals are transmitted via one or more antennas (not shown) coupled to the transmitter. In one example, the system 405 receives intermediate frequency (IF) signals from a previous stage (not shown) that converts baseband signals from a baseband processor into the IF signals. In this example, the system 405 amplifies the IF signals and outputs the amplified IF signals to a subsequent stage (not shown) that frequency upconverts the amplified IF signals into radio frequency (RF) signals for transmission. In other implementations, the system 405 may amplify RF signals.

In certain aspects, the system 405 is configured to amplify signals (e.g., IF signals) in multiple frequency bands. The multiple frequency bands may include the first frequency band and the second frequency band discussed above.

In the example in FIG. 4A, the system 405 includes the first amplifier 120, the second amplifier 150, and the third amplifier 160 discussed above. The system 405 also includes a switchable transformer 410 configured to switch between a first passband and a second passband under the control of a controller 480. In one example, the first passband covers the first frequency band and the second passband covers the second frequency band. As discussed further below, the controller 480 switches the switchable transformer 410 to the first passband in a first mode when the first frequency band is being used and switches the switchable transformer 410 to the second passband in a second mode when the second frequency band is being used.

The switchable transformer 410 has a primary side, a first secondary side, and a second secondary side. As discussed further below, the first secondary side is used for the first passband and the second secondary side is used for the second passband. In this example, the primary side includes a first switchable inductor 440 and a first capacitor 430 coupled in parallel with the first switchable inductor 440. The first switchable inductor 440 is coupled between a first terminal 412 of the switchable transformer 410 and a second terminal 414 of the switchable transformer 410. The first terminal 412 is coupled to the first output 126 of the first amplifier 120 and the second terminal 414 is coupled to the second output 128 of the first amplifier 120.

The first switchable inductor 440 is configured to switch between a first primary inductance and a second primary inductance where the first primary inductance is used for the first passband and the second primary inductance is used for the second passband. In the example in FIG. 4A, the first switchable inductor 440 includes a first inductor 442, a second inductor 444, a third inductor 446, a fourth inductor 448, and a switching circuit 455. The first inductor 442 and the second inductor 444 are coupled in series between the first terminal 412 and the switching circuit 455, and the third inductor 446 and the fourth inductor 448 are coupled in series between the second terminal 414 and the switching circuit 455. The switching circuit 455 is also coupled between the first inductor 442 and the second inductor 444, and between the third inductor 446 and the fourth inductor 448. The switching circuit 455 is also coupled to a bias node 438, which is biased by a DC voltage.

In operation, the switching circuit 455 switches the switchable inductor 440 between the first primary inductance in the first mode and the second primary inductance in the second mode under the control of the controller 480. In the first mode, the switching circuit 455 couples the first inductor 442, the second inductor 444, the third inductor 446, and the fourth inductor 448 in series between the first terminal 412 and the second terminal 414 (and hence between the first output 126 and the second output 128 of the first amplifier 120). In the first mode, the first primary inductance of the first switchable inductor 440 has an inductance equal to the sum of the inductances of the first inductor 442, the second inductor 444, the third inductor 446, and the fourth inductor 448. The switching circuit 455 may also couple the bias node 438 between the second inductor 444 and the third inductor 446 in which the bias node provides a common mode voltage for the differential signal at the differential output of the first amplifier 120.

In the second mode, the switching circuit 455 couples the first inductor 442 and the fourth inductor 448 in series between the first terminal 412 and the second terminal 414 (and hence between the first output 126 and the second output 128 of the first amplifier 120). In the second mode, the switching circuit 455 bypasses the second inductor 444 and the third inductor 446. Thus, the second inductor 444 and the third inductor 446 do not contribute to the inductance of the first switchable inductor 440 in the second mode. In the second mode, the second primary inductance of the first switchable inductor 440 has an inductance equal to the sum of the inductances of the first inductor 442 and the fourth inductor 448. The switching circuit 455 may also couple the bias node 438 between the first inductor 442 and the fourth inductor 448.

In the first mode, the first switchable inductor 440 has a first primary resonance given by following:

$$fr_{p1} = \frac{1}{2\pi\sqrt{C_1 L_{p1}}} \quad (3)$$

where $fr_{p1}$ is the first primary resonance frequency, $C_1$ is the capacitance of the first capacitor 430, and $L_{p1}$ is the first primary inductance. $C_1$ may also include parasitic capacitance at the outputs 126 and 128 of the first amplifier 120. In the second mode, the first switchable inductor 440 has a second primary resonance frequency given by the following:

$$fr_{p2} = \frac{1}{2\pi\sqrt{C_1 L_{p2}}} \quad (4)$$

where $fr_{p2}$ is the second primary resonance frequency and $L_{p2}$ is the second primary inductance. Thus, the first switchable inductor 440 allows the primary side of the switchable transformer 410 to switch between a first primary resonance frequency in the first mode and a second primary resonance frequency in the second mode.

The first secondary side of the switchable transformer 410 includes a second switchable inductor 460 and a second capacitor 432 coupled in parallel with the second switchable inductor 460. The second switchable inductor 460 is coupled between a third terminal 416 of the switchable transformer 410 and a fourth terminal 418 of the switchable transformer 410. The third terminal 416 is coupled to the first input 152 of the second amplifier 150 (e.g., via one or more metal lines, a transmission line, or a combination thereof) and the fourth terminal 418 is coupled to the second input 154 of the second amplifier 150 (e.g., via one or more metal lines, a transmission line, or a combination thereof). The second switchable inductor 460 is magnetically coupled to the first switchable inductor 440 by a coupling factor $K_1$ which may depend on the overlap between the second switchable inductor 460 and the first switchable inductor 440.

The second switchable inductor 460 includes a fifth inductor 462, a sixth inductor 464, and a switch 466 coupled between the fifth inductor 462 and the sixth inductor 464. In the first mode, the controller 480 closes the switch 466. Thus, in the first mode, the second switchable inductor 460 has an inductance given by the sum of the inductances of the fifth inductor 462 and the sixth inductor 464. In the second mode, the controller 480 opens the switch 466, which decouples the fifth inductor 462 and the sixth inductor 464. This effectively disables the second switchable inductor 460.

In the example shown in FIG. 4A, the switch 466 is located at the center of the second switchable inductor 460, which acts as a virtual ground for a differential signal at the second switchable inductor 460. In this example, locating the switch 466 at the virtual ground significantly reduces the impact that the parasitic capacitance of the switch 466 has on the differential signal. However, it is to be appreciated that the present disclosure is not limited to this example. In other implementations, the switch 466 may be placed in another location in the second switchable inductor 460, as discussed further below.

In the first mode, the second switchable inductor 460 has a first secondary resonance frequency given by the following:

$$fr_{s1} = \frac{1}{2\pi\sqrt{C_2 L_2}} \quad (5)$$

where $fr_{s1}$ is the first secondary resonance frequency, $C_2$ is the capacitance of the second capacitor 432, and $L_2$ is the inductance of the second switchable inductor 460. $C_2$ may also include parasitic capacitance at the inputs 152 and 154 of the second amplifier 150.

The second secondary side of the switchable transformer 410 includes a third switchable inductor 470 and a third capacitor 434 coupled in parallel with the third switchable inductor 470. The third switchable inductor 470 is coupled between a fifth terminal 420 of the switchable transformer 410 and a sixth terminal 422 of the switchable transformer 410. The fifth terminal 420 is coupled to the first input 162 of the third amplifier 160 (e.g., via one or more metal lines, a transmission line, or a combination thereof) and the sixth terminal 422 is coupled to the second input 164 of the third amplifier 160 (e.g., via one or more metal lines, a transmission line, or a combination thereof). The third switchable inductor 470 is magnetically coupled to the first switchable inductor 440 by a coupling factor $K_2$ which may depend on the overlap between the third switchable inductor 470 and the first switchable inductor 440.

The third switchable inductor 470 includes a seventh inductor 472, an eighth inductor 474, and a switch 476 coupled between the seventh inductor 472 and the eighth inductor 474. In the first mode, the controller 480 opens the switch 476 which decouples the seventh inductor 472 and the eighth inductor 474. This effectively disables the third switchable inductor 470. In the second mode, the controller 480 closes the switch 476. Thus, in the second mode, the third switchable inductor 470 has an inductance given by the sum of the inductances of the seventh inductor 472 and the eighth inductor 474.

In the example shown in FIG. 4A, the switch 476 is located at the center of the third switchable inductor 470, which acts as a virtual ground for a differential signal at the third switchable inductor 470. In this example, locating the switch 476 at the virtual ground significantly reduces the impact that the parasitic capacitance of the switch 476 has on the differential signal. However, it is to be appreciated that the present disclosure is not limited to this example. In other implementations, the switch 476 may be placed in another location in the third switchable inductor 470, as discussed further below.

In the second mode, the third switchable inductor 470 has a second secondary resonance frequency given by the following:

$$fr_{s2} = \frac{1}{2\pi\sqrt{C_3 L_3}} \quad (6)$$

where $fr_{s2}$ is the second secondary resonance frequency, $C_3$ is the capacitance of the third capacitor 434, and $L_3$ is the inductance of the third switchable inductor 470. $C_3$ may also include parasitic capacitance at the inputs 162 and 164 of the third amplifier 160.

Figure 5A:
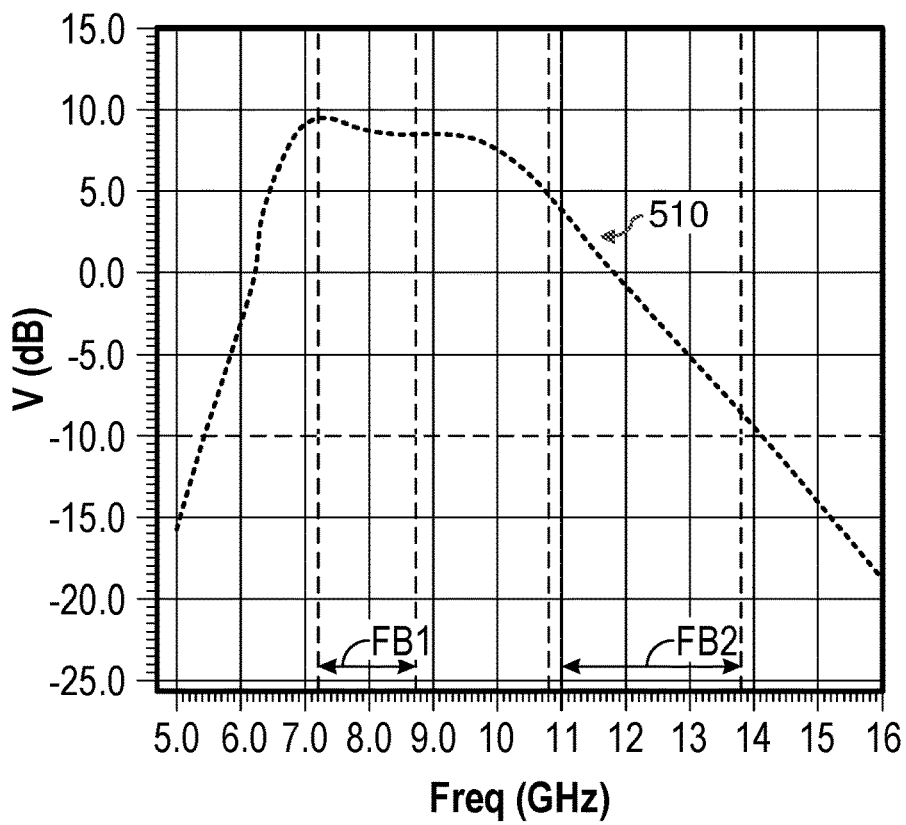
FIG. 5A shows an exemplary frequency response in a first mode according to certain aspects of the present disclosure.

As discussed above, the controller 480 switches the switchable transformer 410 to the first mode when the first frequency band is being used. In the first mode, the switchable transformer 410 has a first passband that is a function of the first primary resonance $fr_{p1}$ given in equation (3), the first secondary resonance frequency $fr_{s1}$ given in equation (5), and the first coupling factor $K_1$ discussed above. In certain aspects, the first passband is configured to cover the first frequency band by setting the first primary resonance $fr_{p1}$, the first secondary resonance frequency $fr_{s1}$, and the first coupling factor $K_1$ accordingly. An example of the first passband 510 is shown in FIG. 5A. In this example, the first passband 510 covers the first frequency band (labeled "FB1") and therefore provides high gain for the first frequency band. In addition, the first passband 510 has a narrower bandwidth than the wide passband 310 shown in FIG. 3, and therefore reduces power consumption of the first amplifier 120.

Figure 5B:
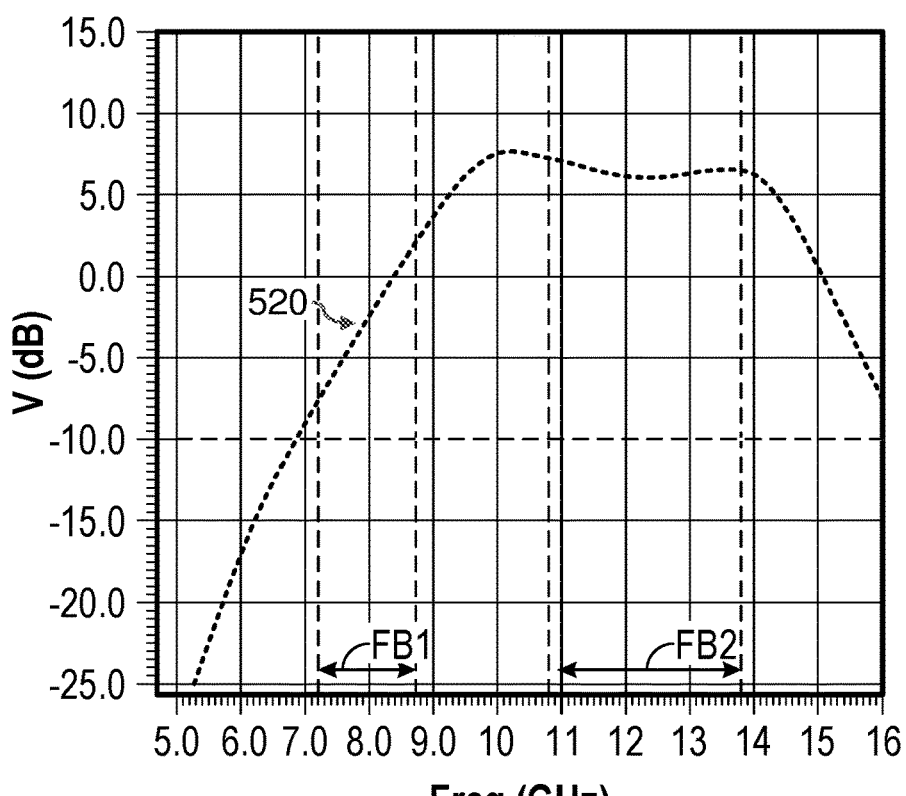
FIG. 5B shows an exemplary frequency response in a second mode according to certain aspects of the present disclosure.

In the second mode, the switchable transformer 410 has a second passband that is a function of the second primary resonance $fr_{p2}$ given in equation (4), the second secondary resonance frequency $fr_{s2}$ given in equation (6), and the second coupling factor $K_2$ discussed above. In certain aspects, the second passband is configured to cover the second frequency band by setting the second primary resonance $fr_{p2}$, the second secondary resonance frequency $fr_{s2}$, and the second coupling factor $K_2$ accordingly. An example of the second passband 520 is shown in FIG. 5B. In this example, the second passband 520 covers the second frequency band (labeled "FB2") and therefore provides high gain for the second frequency band. In addition, the second passband 520 has a narrower bandwidth than the wide passband 310 shown in FIG. 3, and therefore reduces power consumption of the first amplifier 120.

Each of the capacitors 430, 432, and 434 may be implemented with a variable capacitor (shown in the example in FIG. 4A) or a fixed capacitor. For example, the first capacitor 430 may be implemented with a variable capacitor to finely tune the resonance frequency of the primary side of the switchable transformer 410 (e.g., to compensate for process-voltage-temperature (PVT) variation). Similarly, the second capacitor 432 may be implemented with a variable capacitor to finely tune the resonance frequency of the first secondary side of the switchable transformer 410 (e.g., to compensate for PVT variation), and the third capacitor 434 may be implemented with a variable capacitor to finely tune the resonance frequency of the second secondary side of the switchable transformer 410 (e.g., to compensate for PVT variation).

Figure 4B:
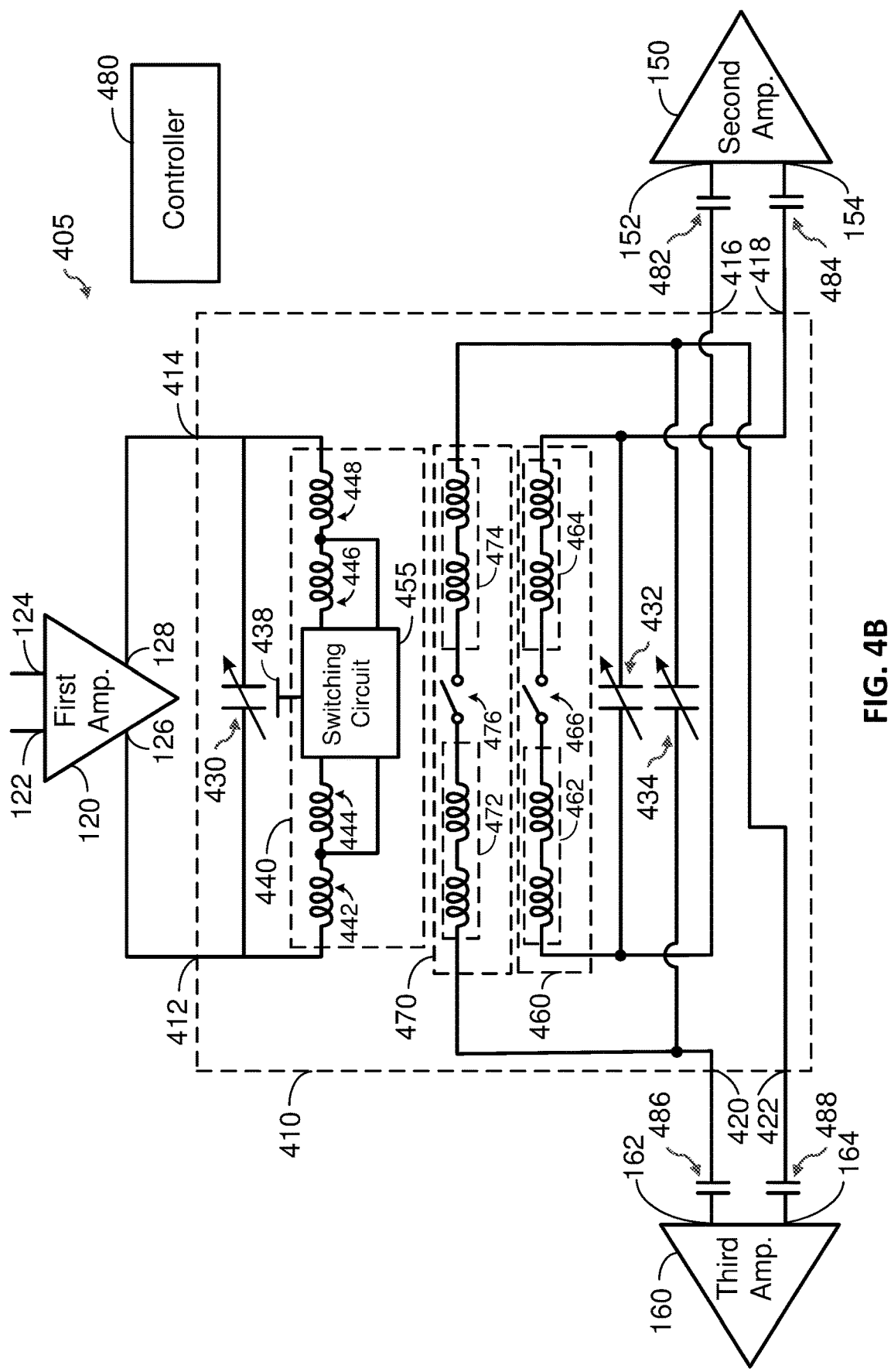
FIG. 4B shows an example of amplifiers coupled to the switchable transformer via coupling capacitors according to certain aspects of the present disclosure.

In some implementations, the inputs 152 and 154 of the second amplifier 150 may be DC biased through a center tap of the second switchable inductor 460. In other implementations, the inputs 152 and 154 of the second amplifier 150 may be DC biased by a separate DC bias voltage source (not shown) (e.g., for the case where the inputs 152 and 154 of the second amplifier 150 are coupled to the switchable transformer 410 via long transmission lines). In this example, the system 405 may include coupling capacitors between the inputs 152 and 154 of the second amplifier 150 and the switchable transformer 410 to isolate the DC bias voltage at the inputs 152 and 154 of the second amplifier 150 from the switchable transformer 410. In this regard, FIG. 4B shows an example of a first coupling capacitor 482 coupled between the first input 152 of the second amplifier 150 and the third terminal 416 of the switchable transformer 410, and a second coupling capacitor 484 coupled between the second input 154 of the second amplifier 150 and the fourth terminal 418 of the switchable transformer 410.

In some implementations, the inputs 162 and 164 of the third amplifier 160 may be DC biased through a center tap of the third switchable inductor 470. In other implementations, the inputs 162 and 164 of the third amplifier 160 may be DC biased by a separate DC bias voltage source (not shown) (e.g., for the case where the inputs 162 and 164 of the third amplifier 160 are coupled to the switchable transformer 410 via long transmission lines). In this example, the system 405 may include coupling capacitors between the inputs 162 and 164 of the third amplifier 160 and the switchable transformer 410 to isolate the DC bias voltage at the inputs 162 and 164 of the third amplifier 160 from the switchable transformer 410. In this regard, FIG. 4B shows an example of a third coupling capacitor 486 coupled between the first input 162 of the third amplifier 160 and the fifth terminal 420 of the switchable transformer 410, and a fourth coupling capacitor 488 coupled between the second input 164 of the third amplifier 160 and the sixth terminal 422 of the switchable transformer 410.

Figure 4C:
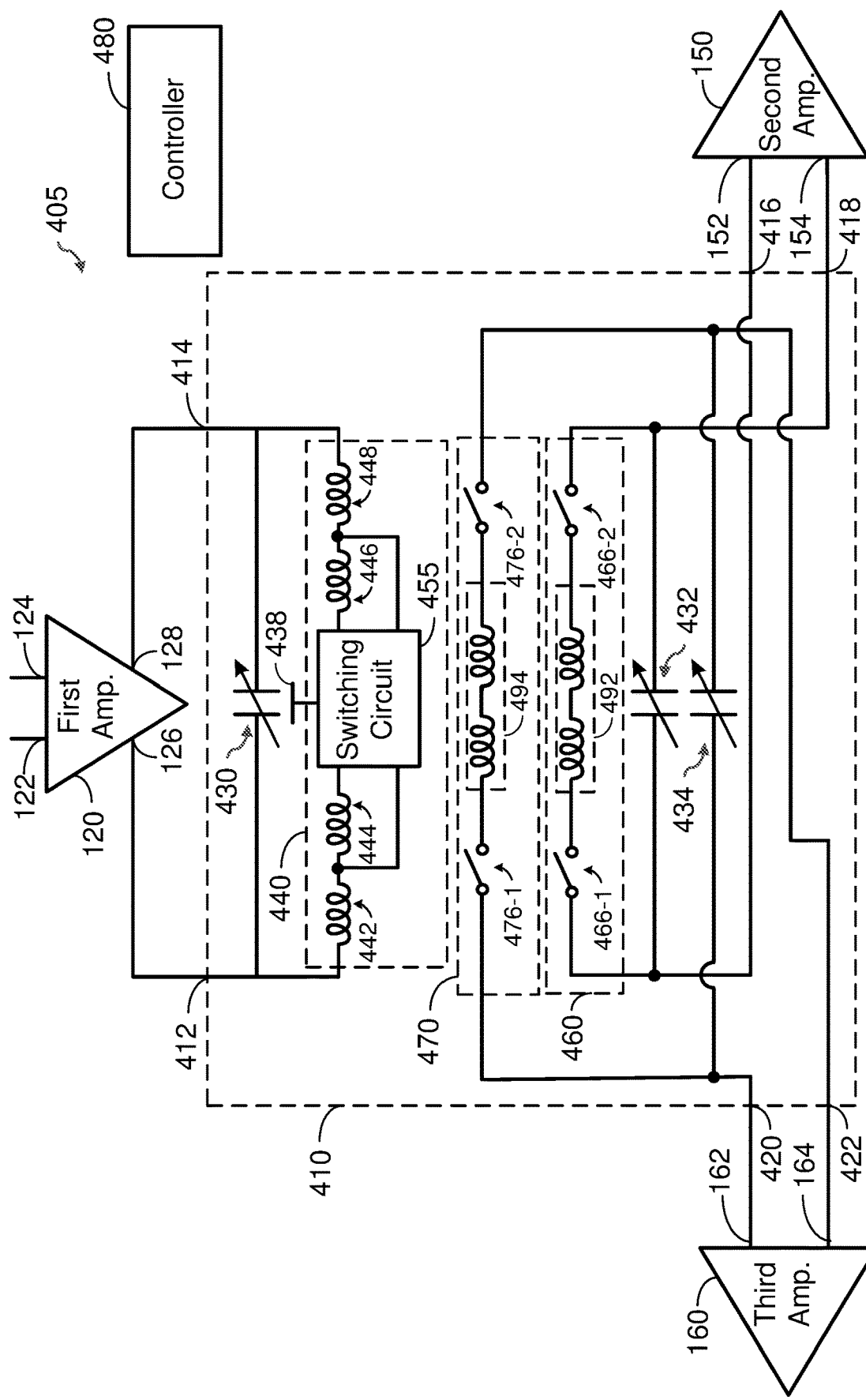
FIG. 4C shows another example of an amplifier with a switchable transformer according to certain aspects of the present disclosure.

FIG. 4C shows another exemplary implementation of the second switchable inductor 460 and the third switchable inductor 470. In this example, the second switchable inductor 460 includes an inductor 492, a first switch 466-1 coupled between the inductor 492 and the third terminal 416 and a second switch 466-2 coupled between the inductor 492 and the fourth terminal 418. In the first mode, the controller 480 closes the switches 466-1 and 466-2 and, in the second mode, the controller 480 opens the switches 466-1 and 466-2. However, it is to be appreciated that the second switchable inductor 460 is not limited to the exemplary implementations shown in FIGS. 4A and 4C. In general, the second switchable inductor 460 includes at least one inductor and at least one switch coupled in series with the at least one inductor in which the second switchable inductor 460 is enabled when the at least one switch is closed and disabled with the at least one switch is open. In the examples in FIGS. 4A and 4C, the second capacitor 432 is coupled in parallel with the at least one inductor and the at least one switch.

In this example, the third switchable inductor 470 includes an inductor 494, a first switch 476-1 coupled between the inductor 494 and the fifth terminal 420 and a second switch 476-2 coupled between the inductor 494 and the sixth terminal 422. In the first mode, the controller 480 opens the switches 476-1 and 476-2 and, in the second mode, the controller 480 closes the switches 476-1 and 476-2. However, it is to be appreciated that the third switchable inductor 470 is not limited to the exemplary implementations shown in FIGS. 4A and 4C. In general, the third switchable inductor 470 includes at least one inductor and at least one switch coupled in series with the at least one inductor in which the third switchable inductor 470 is enabled when the at least one switch is closed and disabled with the at least one switch is open. In the examples in FIGS. 4A and 4C, the third capacitor 434 is coupled in parallel with the at least one inductor and the at least one switch.

Figure 6:
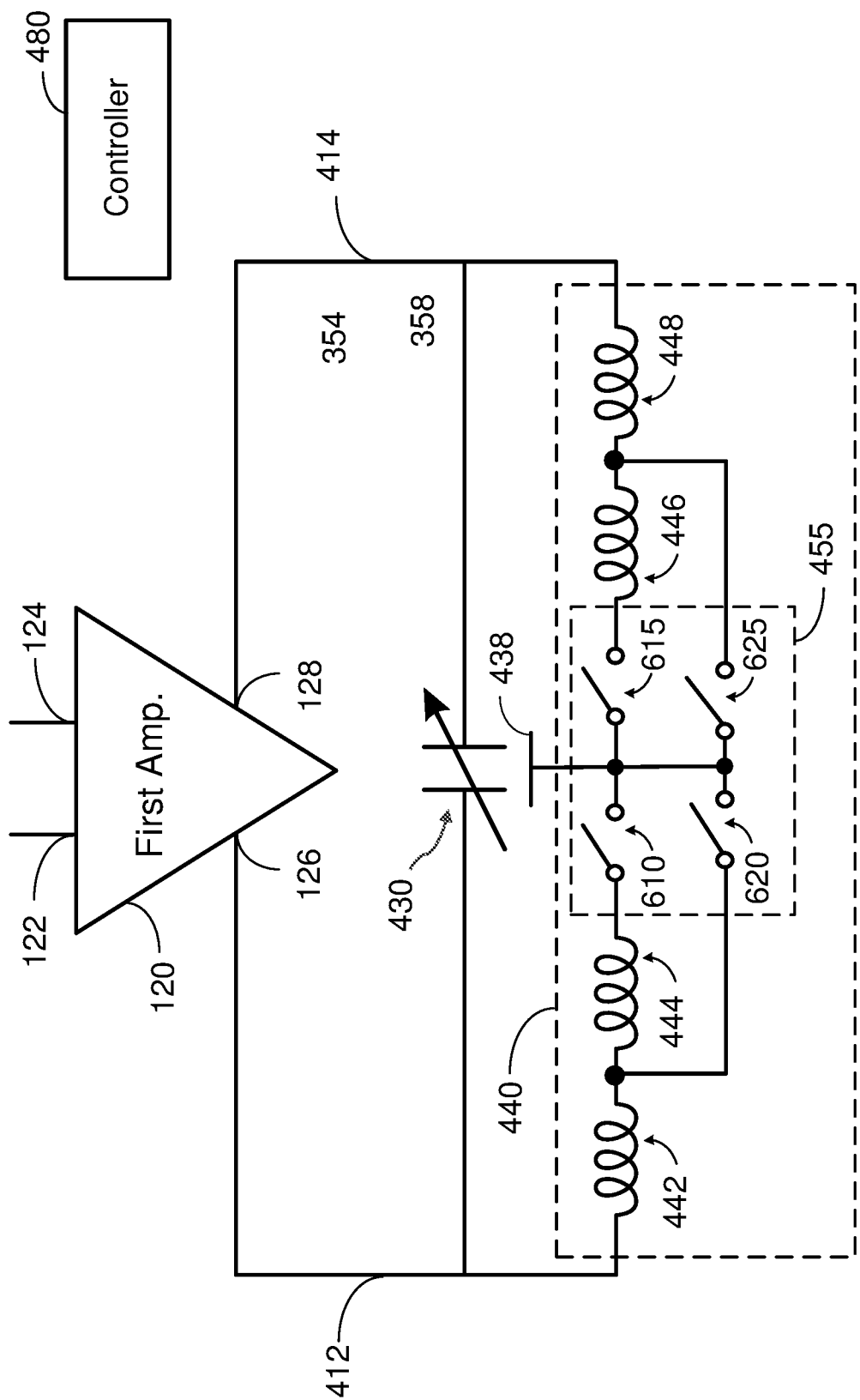
FIG. 6 shows an exemplary implementation of a switching circuit according to certain aspects of the present disclosure.

FIG. 6 shows an exemplary implementation of the switching circuit 455. In this example, the switching circuit 455 includes a first switch 610 coupled between the second inductor 444 and the bias node 438, and a second switch 615 coupled between the third inductor 446 and the bias node 438. The switching circuit 455 also includes a third switch 620 coupled between the first inductor 442 and the bias node, and a fourth switch 625 coupled between the fourth inductor 448 and the bias node 438.

In the first mode, the controller 480 closes the first switch 610 and the second switch 615, and opens the third switch 620 and the fourth switch 625. As a result, the first inductor 442, the second inductor 444, the third inductor 446, and the fourth inductor 448 coupled in series between the first terminal 412 and the second terminal 414. In this mode, the primary side has the first primary inductance discussed above which is equal to the sum of the inductances of the first inductor 442, the second inductor 444, the third inductor 446, and the fourth inductor 448.

In the second mode, the controller 480 opens the first switch 610 and the second switch 615, and closes the third switch 620 and the fourth switch 625. As a result, the first inductor 442 and the fourth inductor 448 are coupled in series between the first terminal 412 and the second terminal 414. In this mode, the primary side has the second primary inductance discussed above which is equal to the sum of the inductances of the first inductor 442 and the fourth inductor 448.

In the example shown in FIG. 6, the switches 610, 615, 620, and 625 are located adjacent to the center of the first switchable inductor 440, which acts as a virtual ground for a differential signal at the first switchable inductor 440. In this example, locating the switches 610, 615, 620, and 625 adjacent to the virtual ground significantly reduces the impact that the parasitic capacitances of the switches 610, 615, 620, and 625 have on the differential signal.

It is to be appreciated that the switching circuit 455 is not limited to the exemplary implementation shown in FIG. 6. In this regard, it is to be appreciated that the exemplary functions of the switching circuit 455 discussed above may be realized using other arrangements of switches.

It is also to be appreciated that the first switchable inductor 440 is not limited to the exemplary implementation shown in FIG. 6. In this regard, it is to be appreciated that the first switchable inductor 440 may be implemented with other arrangements of two or more inductors and one or more switches configured to switch the first switchable inductor 440 between the first primary inductance and the second primary inductance. In general, the first switchable inductor 440 may include at least one first inductor (e.g., inductors 442 and 448), at least one second inductor (e.g., inductors 444 and 446) coupled in series with the at least one first inductor, and at least one switch (e.g., switches 620 and 625) coupled in parallel with the at least one second inductor. In general, the first switchable inductor 440 may be switched to the first primary inductance by opening the at least one switch, in which the first primary inductance is equal to the sum of the inductances of the at least one first inductor and the at least one second inductor. The first switchable inductor 440 may be switched to the second primary inductance by closing the at least one switch, in which the second primary inductance is equal to the inductance of the at least one first inductor. In this case, the at least one second inductor is bypassed. In general, the first capacitor 430 is coupled in parallel with the at least one first inductor and the at least one second inductor.

Figure 7A:
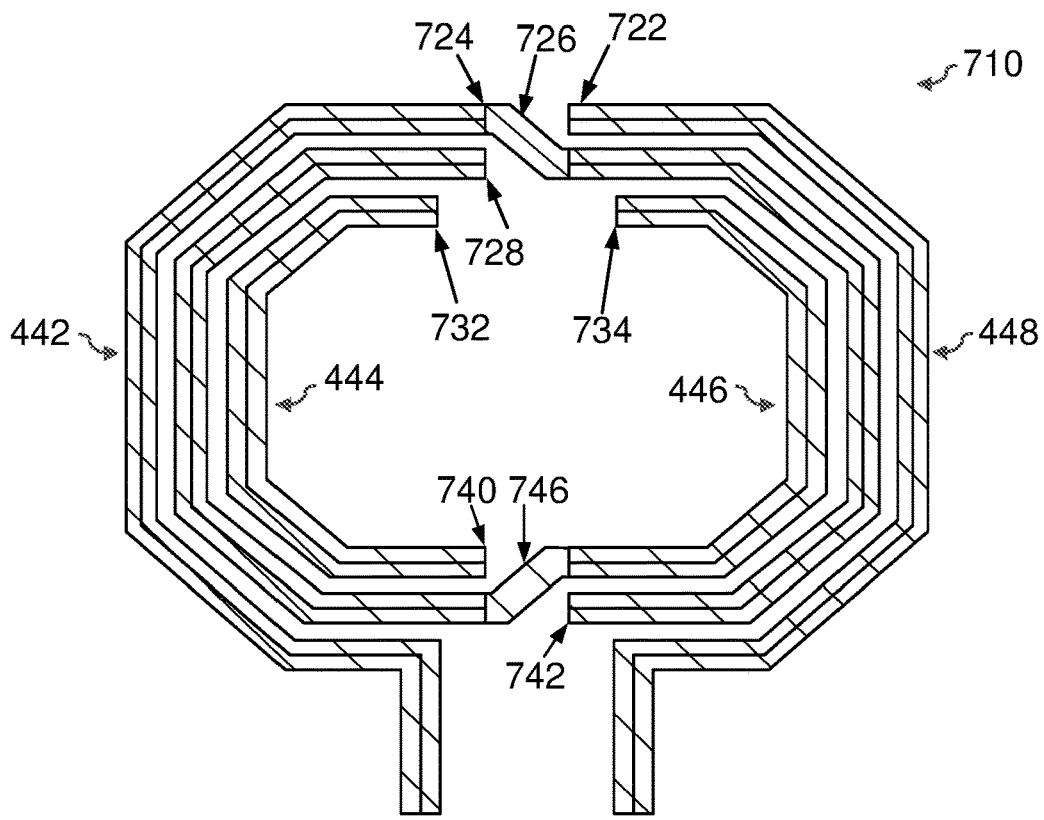
FIG. 7A shows an exemplary inductor according to certain aspects of the present disclosure.

FIG. 7A shows a top view of an example of an inductor 710 that may be used to implement the first inductor 442, the second inductor 444, the third inductor 446, and the fourth inductor 448. However, it is to be appreciated that the present disclosure is not limited to this example, and that the first inductor 442, the second inductor 444, the third inductor 446, and the fourth inductor 448 may be implemented with another inductor.

Figure 7B:
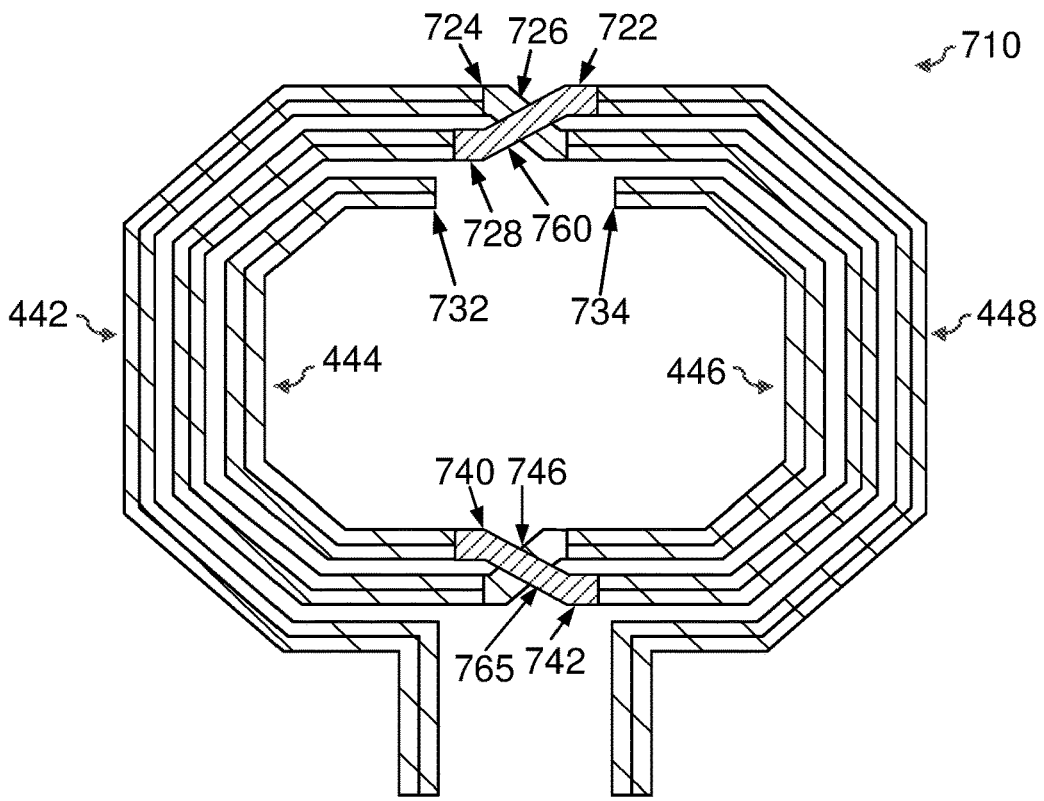
FIG. 7B shows an example of the inductor in FIG. 7A in which one portion of the inductor crosses another portion of the inductor according to certain aspects of the present disclosure.

In this example, the inductor 710 is a planar spiral inductor integrated on a chip. The inductor 710 may be formed from a first metal layer on the chip using photolithography and/or another fabrication technique. The different portions of the inductor 710 corresponding to the first inductor 442, the second inductor 444, the third inductor 446, and the fourth inductor 448 are labeled in FIG. 7A according to certain aspects. In the example in FIG. 7A, ends 722 and 728 of the inductor 710 are coupled by a bridge 760 (shown in FIG. 7B) that crosses over portion 726 of the inductor 710. The bridge 760 is formed from a different metal layer than the first metal layer discussed above, and allows one portion of the inductor 710 to cross over another portion of the inductor 710 for the example where the inductor 710 is a spiral inductor. Each end 722 and 728 of the inductor 710 may be coupled to the bridge 760 by a respective via (not shown). It is to be appreciated that, in some implementations, the bridge 760 may cross under portion 726 of the inductor 710. Similarly, ends 740 and 742 of the inductor 710 are coupled by a bridge 765 (shown in FIG. 7B) that crosses over portion 746 of the inductor 710.

In this example, the switching circuit 455 (not shown in FIG. 7A) is coupled between locations 724 and 722 of the inductor 710, and between locations 732 and 734 of the inductor 710. Location 724 corresponds to the terminal of the first inductor 442 coupled to the second inductor 444, and location 722 corresponds to the terminal of the fourth inductor 448 coupled to the third inductor 446. In the second mode, the switching circuit 455 couples the inductor 710 to the bias node 438 (not shown in FIG. 7A) at locations 724 and 722. In this case, the inductance of the first switchable inductor 440 is approximately equal to the sum of the inductances of the first inductor 442 and the fourth inductor 448.

Location 732 corresponds to the terminal of the second inductor 444 coupled to the switching circuit 455, and location 734 corresponds to the terminal of the third inductor 446 coupled to the switching circuit 455. In this example, locations 732 and 734 of the inductor 710 correspond to two ends of the inductor 710 separated by a gap. In the first mode, the switching circuit 455 couples the inductor 710 to the bias node 438 at locations 732 and 734. In this case, the inductance of the first switchable inductor 440 is approximately equal to the sum of the inductances of the first inductor 442, the second inductor 444, the third inductor 446, and the fourth inductor 448.

Figure 8A:
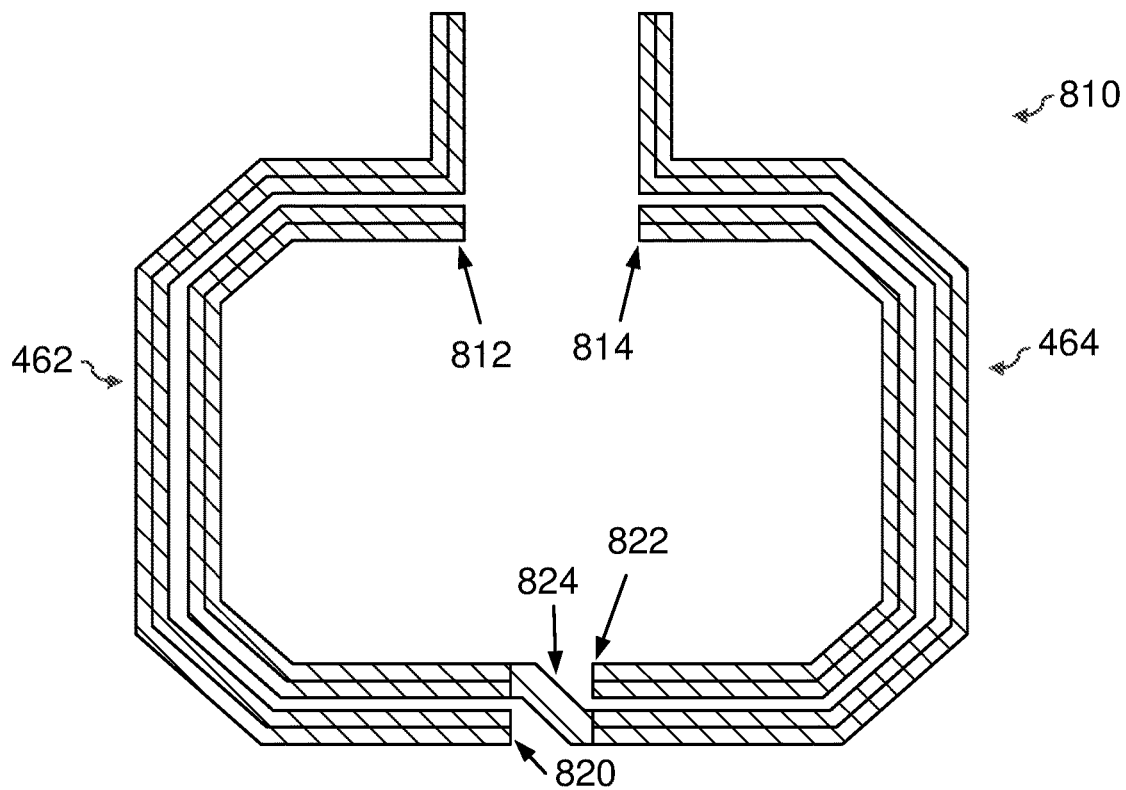
FIG. 8A shows another exemplary inductor according to certain aspects of the present disclosure.

FIG. 8A shows a top view of an example of an inductor 810 that may be used to implement the fifth inductor 462 and the sixth inductor 464. However, it is to be appreciated that the present disclosure is not limited to this example, and that the fifth inductor 462 and the sixth inductor 464 may be implemented with another inductor.

Figure 8B:
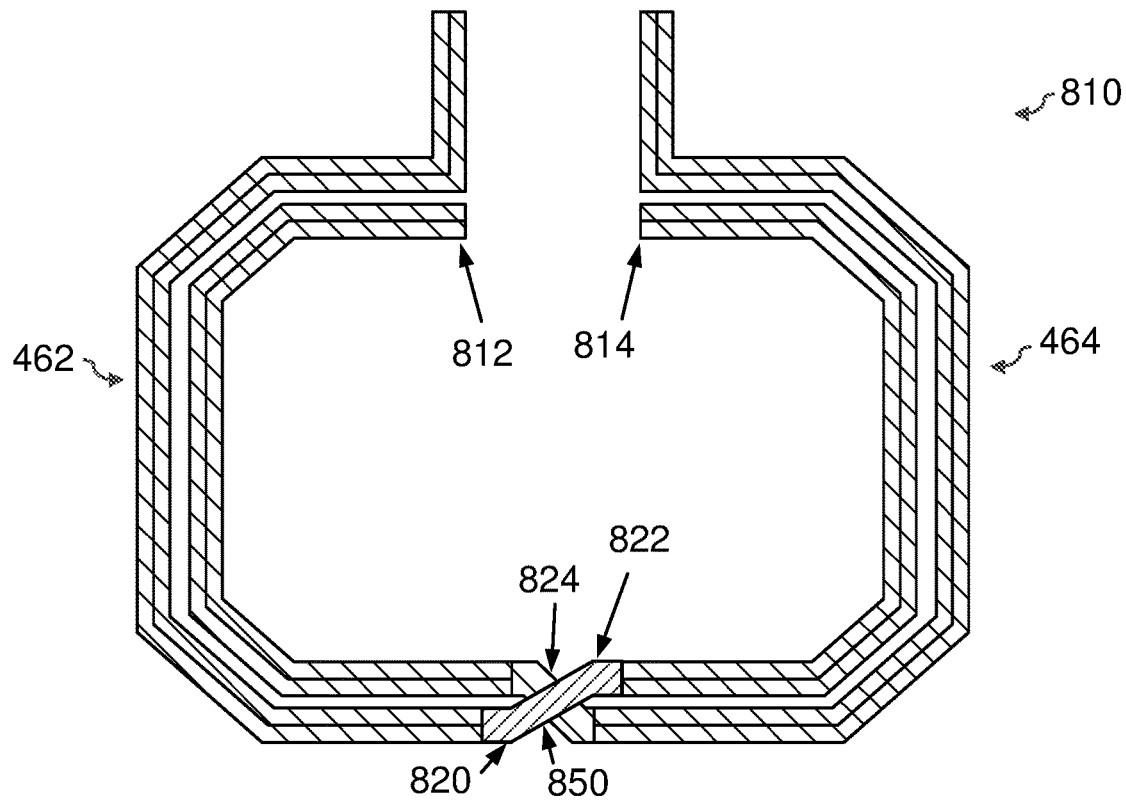
FIG. 8B shows an example of the inductor in FIG. 8A in which one portion of the inductor crosses another portion of the inductor according to certain aspects of the present disclosure.

In this example, the inductor 810 is a planar spiral inductor integrated on a chip. The inductor 810 may be formed from a second metal layer on the chip using photolithography and/or another fabrication technique. The different portions of the inductor 810 corresponding to the fifth inductor 462 and the sixth inductor 464 are labeled in FIG. 8A according to certain aspects. In the example in FIG. 8A, ends 820 and 822 of the inductor 810 are coupled by a bridge 850 (shown in FIG. 8B) that crosses over portion 824 of the inductor 810. The bridge 850 is formed from a different metal layer than the second metal layer discussed above, and allows one portion of the inductor 810 to cross over another portion of the inductor 810 for the example where the inductor 810 is a spiral inductor. Each end 820 and 822 of the inductor 810 may be coupled to the bridge 850 by a respective via (not shown). It is to be appreciated that, in some implementations, the bridge 850 may cross under portion 824 of the inductor 810.

In this example, the switch 466 (not shown in FIG. 8A) is coupled between locations 812 and 814 of the inductor 810. Location 812 corresponds to the terminal of the sixth inductor 464 coupled to the switch 466, and location 814 corresponds to the terminal of the fifth inductor 462 coupled to the switch 466. The controller 480 (not shown in FIG. 8A) turns on the switch 466 in the first mode and turns off the switch 466 in the second mode.

Figure 9:
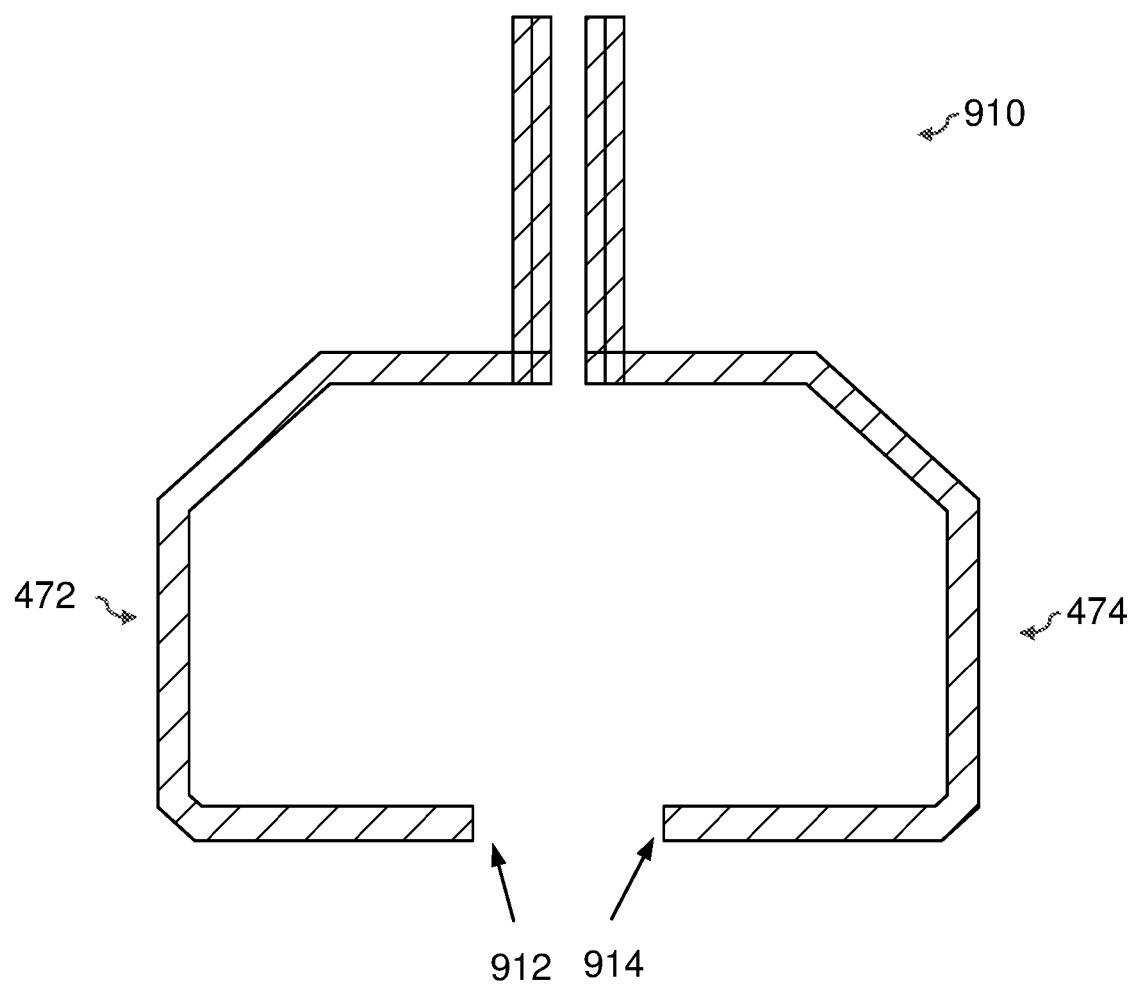
FIG. 9 shows yet another exemplary inductor according to certain aspects of the present disclosure.

FIG. 9 shows a top view of an example of an inductor 910 that may be used to implement the seventh inductor 472 and the eighth inductor 474. However, it is to be appreciated that the present disclosure is not limited to this example, and that the seventh inductor 472 and the eighth inductor 474 may be implemented with another inductor.

In this example, the inductor 910 is a planar loop inductor. The inductor 910 may be formed from a third metal layer on the chip using photolithography and/or another fabrication technique. The different portions of the inductor 910 corresponding to the seventh inductor 472 and the eighth inductor 474 are labeled in FIG. 9 according to certain aspects.

In this example, the switch 476 (not shown in FIG. 9) is coupled between locations 912 and 914 of the inductor 910. Location 912 corresponds to the terminal of the seventh inductor 472 coupled to the switch 476, and location 914 corresponds to the terminal of the eighth inductor 474 coupled to the switch 476. The controller 480 (not shown in FIG. 9) turns off the switch 476 in the first mode and turns on the switch 476 in the second mode.

Figure 10:
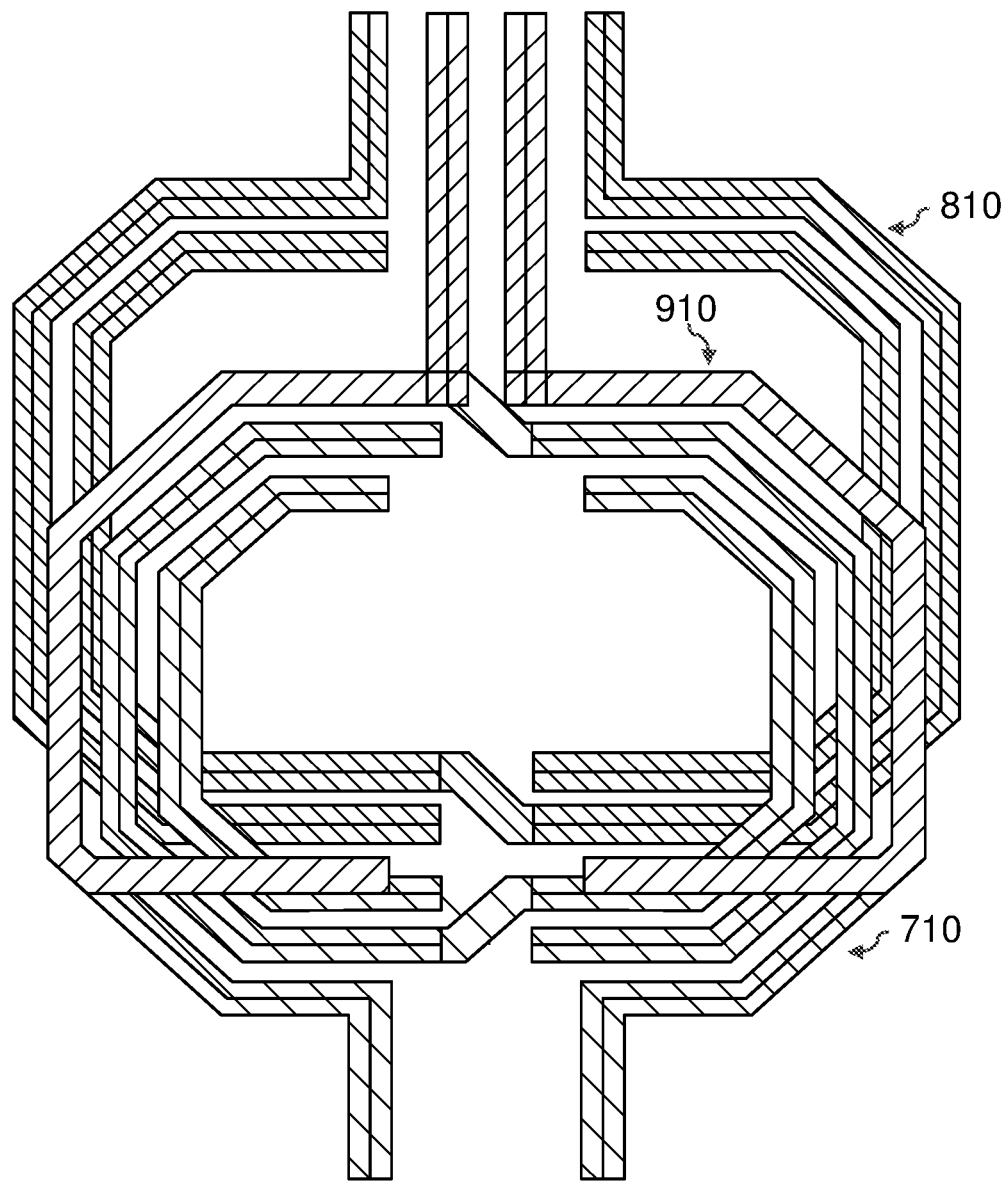
FIG. 10 shows an example in which the exemplary inductors shown in FIGS. 7A, 8A and 9 overlap to form a switchable transformer according to certain aspects of the present disclosure.

FIG. 10 shows a top view of the inductors 710, 810, and 910 according to certain aspects.

In this example, the inductor 810 overlaps the inductor 710 to provide magnetic coupling of the inductors 710 and 810, and the inductor 910 overlaps the inductor 710 to provide magnetic coupling of the inductors 710 and 910. The overlapping of the inductors 710, 810, and 910 is possible since the inductors 710, 810, and 910 are formed from different metal layers on the chip. More particularly, the inductor 710 is formed from the first metal layer of the chip, the inductor 810 is formed from the second metal layer of the chip, and the inductor 910 is formed from the third metal layer of the chip. In the example in FIG. 10, the inductor 810 is located below the inductor 710, and the inductor 910 is located above the inductor 710. However, it is to be appreciated that the present disclosure is not limited to this example. In another implementation, the inductor 810 may be located above the inductor 710, and the inductor 910 may be located below the inductor 710.

The degree of overlap between the inductor 710 and the inductor 810 determines the coupling factor $K_1$ between the primary side and the first secondary side of the switchable transformer 410. Thus, in this example, a desired coupling factor $K_1$ between the primary side and the first secondary side can be achieved by laying out the inductors 710 and 810 such that the overlap between the inductors 710 and 810 corresponds to the desired coupling factor $K_1$.

Similarly, the degree of overlap between the inductor 710 and the inductor 910 determines the coupling factor $K_2$ between the primary side and the second secondary side of the switchable transformer 410. Thus, in this example, a desired coupling factor $K_2$ between the primary side and the second secondary side can be achieved by laying out the inductors 710 and 910 such that the overlap between the inductors 710 and 910 corresponds to the desired coupling factor $K_2$.

It is to be appreciated that the terms "first metal layer," "second metal layer," and "third metal layer" are used herein as a convenient way of distinguishing between the different metal layers used to form the inductors 810, 710, and 910. In certain aspects, the first metal layer, the second metal, and the third metal layer may include the top three metal layers of a chip to minimize parasitic capacitances. However, it is to be appreciated that the first metal layer, the second metal layer, and the third metal layer are not limited to this example.

Figure 11:
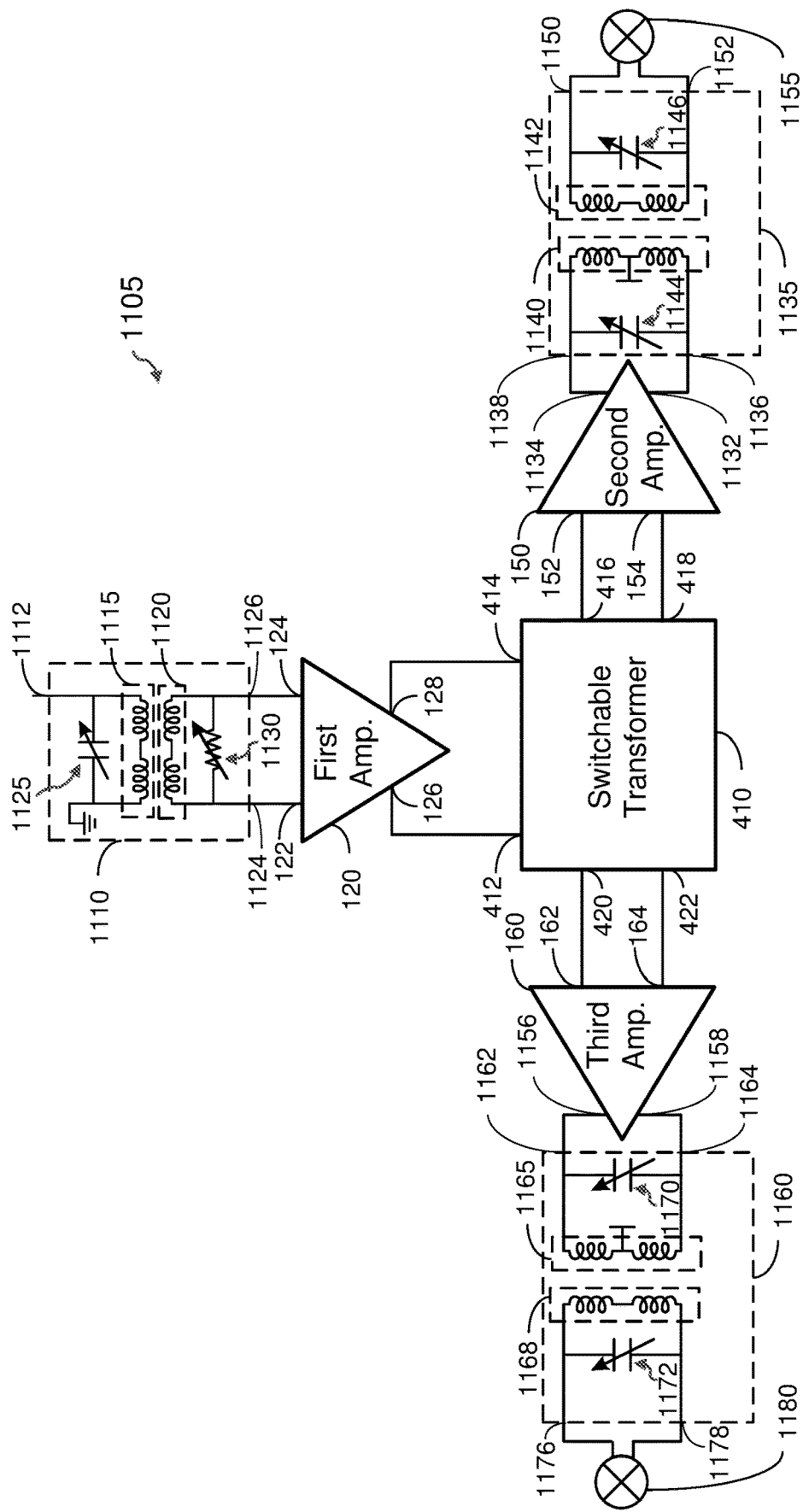
FIG. 11 shows an example of a system including a switchable transformer and multiple amplifiers according to certain aspects of the present disclosure

FIG. 11 shows an example of a system 1105 in a transmitter according to certain aspects. The system 1105 includes the exemplary system 405 illustrated in any one of FIGS. 4A to 4C. The system 1105 also includes a first transformer 1110, a second transformer 1135, a first mixer 1155, a third transformer 1160, and a second mixer 1180.

In the example in FIG. 11, the primary side of the first transformer 1110 includes a first inductor 1115 and a capacitor 1125 coupled in parallel between ground and a first terminal 1112 of the first transformer 1110. The secondary side of the first transformer 1110 includes a second inductor 1120 and a resistor 1130 coupled in parallel between a second terminal 1124 and a third terminal 1126 of the first transformer 1110. The first inductor 1115 and the second inductor 1120 are magnetically coupled (i.e., inductively coupled).

In this example, the first terminal 1112 of the first transformer 1110 is coupled to a previous stage (not shown) of the transmitter. The previous stage may receive a baseband signal (e.g. from a baseband processor), convert the baseband signal into an IF signal, and input the IF signal to the first terminal 1112 of the first transformer 1110. The differential input of the first amplifier 120 is coupled to the secondary side of the first transformer 1110. More particularly, the second terminal 1124 of the first transformer 1110 is coupled to the first input 122 of the first amplifier 120 and the third terminal 1126 of the first transformer 1110 is coupled to the second input 124 of the first amplifier 120. The first amplifier 120 may have parasitic capacitance at the inputs 122 and 124 in which the resonance frequency at the secondary side of the first transformer 1110 is determined by the inductance of the second inductor 1120 and the parasitic capacitance.

In this example, the first transformer 1110 is configured to have a passband covering the first frequency band and the second frequency band so that signals in both frequency bands are passed to the first amplifier 120. In this regard, the inductances of the first and second inductors 1115 and 1120, the capacitance of the capacitor 1125, and the coupling factor K between the first and second inductors 1115 and 1120 are chosen to achieve a passband covering the first and second frequency bands. The resistor 1130 may be used for de-Qing at the differential input of the first amplifier 120. In this example, the first transformer 1110 may also be configured to convert a single-ended IF signal received at the first terminal 1112 into a differential IF signal at the second and third terminals 1124 and 1126.

In the example in FIG. 11, the primary side of the second transformer 1135 includes a first inductor 1140 and a first capacitor 1144 coupled in parallel between a first terminal 1136 of the second transformer 1135 and a second terminal 1138 of the second transformer 1135. The secondary side of the second transformer 1135 includes a second inductor 1142 and a second capacitor 1146 coupled in parallel between a third terminal 1150 and a fourth terminal 1152 of the second transformer 1135. The first inductor 1140 and the second inductor 1142 are magnetically coupled (i.e., inductively coupled).

In this example, the second amplifier 150 has a differential output including a first output 1132 coupled to the first terminal 1136 of the second transformer 1135, and a second output 1134 coupled to the second terminal 1138 of the second transformer 1135. The third terminal 1150 and the fourth terminal 1152 of the second transformer 1135 are coupled to the first mixer 1155.

In this example, the second transformer 1135 is configured to have a passband covering the first frequency band so that second amplifier 150 amplifies signals in the first frequency band. In this regard, the inductances of the first and second inductors 1140 and 1142, the capacitances of the first and second capacitors 1144 and 1146, and the coupling factor K between the first and second inductors 1140 and 1142 are chosen to achieve a passband covering the first frequency band.

The first mixer 1155 is configured to receive the amplified signal in the first frequency band from the second transformer 1135 and frequency upconvert the signal into an RF signal for transmission. The first mixer 1155 may upconvert the signal by mixing the signal with a first local oscillator signal.

In the example in FIG. 11, the primary side of the third transformer 1160 includes a first inductor 1165 and a first capacitor 1170 coupled in parallel between a first terminal 1162 of the third transformer 1160 and a second terminal 1164 of the third transformer 1160. The secondary side of the third transformer 1160 includes a second inductor 1168 and a second capacitor 1172 coupled in parallel between a third terminal 1176 and a fourth terminal 1178 of the third transformer 1160. The first inductor 1165 and the second inductor 1168 are magnetically coupled (i.e., inductively coupled).

In this example, the third amplifier 160 has a differential output including a first output 1156 coupled to the first terminal 1162 of the third transformer 1160, and a second output 1158 coupled to the second terminal 1164 of the third transformer 1160. The third terminal 1176 and the fourth terminal 1178 of the third transformer 1160 are coupled to the second mixer 1180.

In this example, the third transformer 1160 is configured to have a passband covering the second frequency band so that third amplifier 160 amplifies signals in the second frequency band. In this regard, the inductances of the first and second inductors 1165 and 1168, the capacitances of the first and second capacitors 1170 and 1172, and the coupling factor K between the first and second inductors 1165 and 1168 are chosen to achieve a passband covering the second frequency band.

The second mixer 1180 is configured to receive the amplified signal in the second frequency band from the third transformer 1160 and frequency upconvert the signal into an RF signal for transmission. The second mixer 1180 may upconvert the signal by mixing the signal with a second local oscillator signal.

Each of the capacitors 1125, 1144, 1146, 1170, and 1172 may be implemented with a variable capacitor (shown in the example in FIG. 11) or a fixed capacitor.

Figure 12:
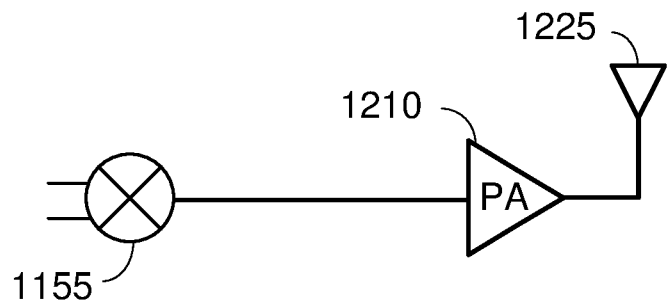
FIG. 12 shows an example of a transmitter including a power amplifier and an antenna according to certain aspects of the present disclosure.

FIG. 12 shows an example in which the transmitter includes a power amplifier 1210 and an antenna 1225. The input of the power amplifier 1210 is coupled to the output of the first mixer 155 and the output of the power amplifier 1210 is coupled to the antenna 1225. The input of the first mixer 1155 is coupled to the second transformer 1135 shown in FIG. 11. In operation, the power amplifier 1210 is configured to receive the RF signal output by the first mixer 1155, amplify the RF signal, and output the amplified RF signal to the antenna 1225 for transmission. It is to be appreciated that the transmitter may include one or more additional components between the first mixer 1155 and the antenna 1225 not shown in FIG. 12.

Figure 13:
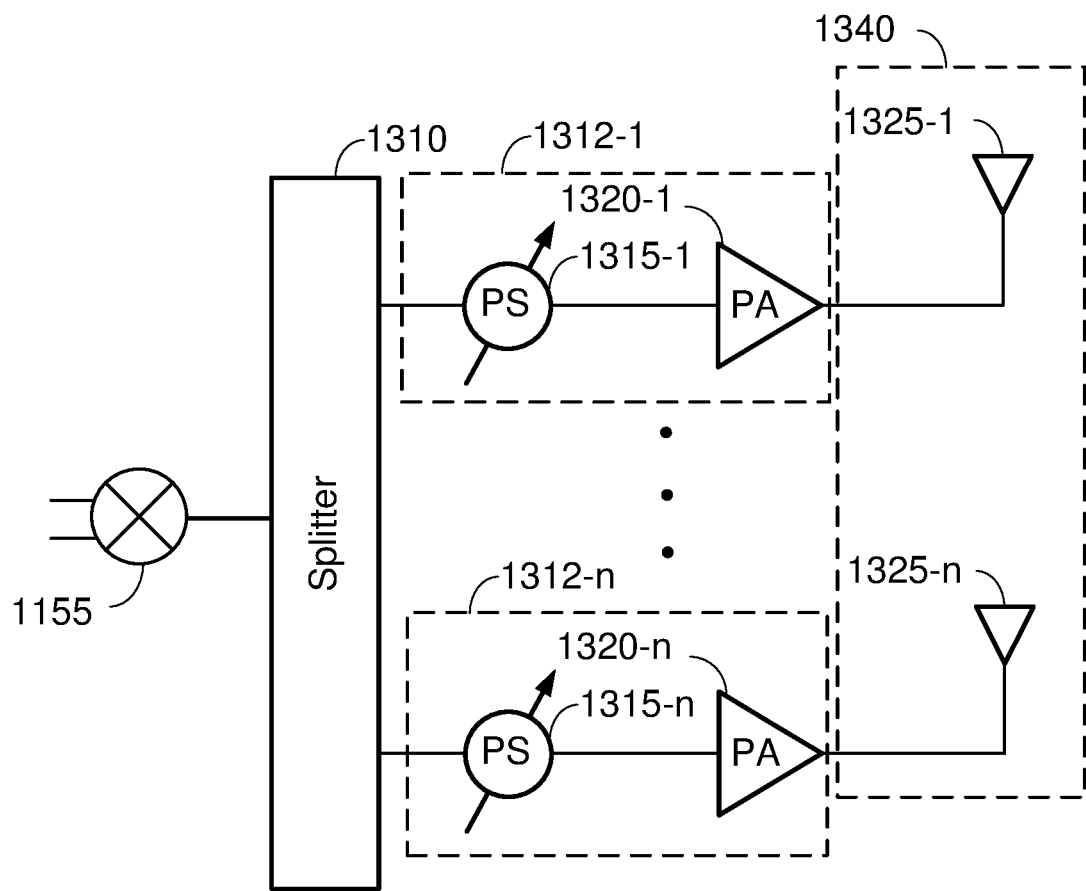
FIG. 13 shows an example of a transmitter including an antenna array according to certain aspects of the present disclosure.

FIG. 13 shows an example in which the transmitter includes a splitter 1310, an antenna array 1340 including multiple antennas 1325-1 to 1325-n, and multiple transmit chains 1312-1 to 1312-n according to certain aspects. The splitter 1310 has an input coupled to the output of the first mixer 1155 and multiple outputs. Each transmit chain 1312-1 to 1312-n is coupled between a respective one of the outputs of the splitter 1310 and a respective one of the antennas 1325-1 to 1325-n.

In this example, each of the transmit chains 1312-1 to 1312-n includes a respective phase shifter 1315-1 to 1315-n and a respective power amplifier 1320-1 to 1320-n. In each transmit chain 1312-1 to 1312-n, the input of the respective phase shifter 1315-1 to 1315-n is coupled to the respective output of the splitter 1310, the input of the respective power amplifier 1320-1 to 1320-n is coupled to the output of the respective phase shifter 1315-1 to 1315-n, and the output of the respective power amplifier 1320-1 to 1320-n is coupled to the respective antenna 1325-1 to 1325-n. Each phase shifter 1315-1 to 1315-n is configured to shift the phase of the respective RF signal by a respective phase. Each power amplifier 1320-1 to 1320-n is configured to amplify the signal from the respective phase shifter 1315-1 to 1315-n and output the amplified signal to the respective antenna 1325-1 to 1325-n for transmission. In operation, a beamformer (not shown) controls the phases of the phase shifters 1315-1 to 1315-*n* to achieve a desired transmit beam direction for the antenna array 1340 using beamforming.

Figure 14:
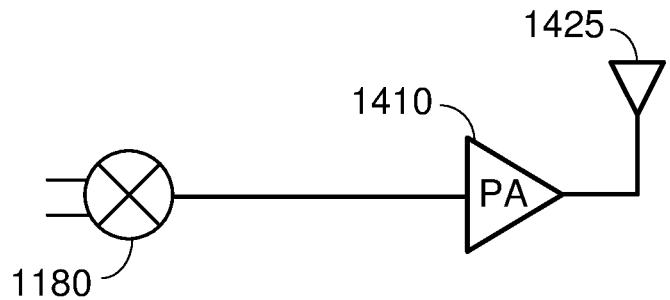
FIG. 14 shows another example of a transmitter including a power amplifier and an antenna according to certain aspects of the present disclosure.

FIG. 14 shows an example in which the transmitter includes a power amplifier 1410 and an antenna 1425. The input of the power amplifier 1410 is coupled to the output of the second mixer 1180 and the output of the power amplifier 1410 is coupled to the antenna 1425. The input of the second mixer 1180 is coupled to the third transformer 1160 shown in FIG. 11. In operation, the power amplifier 1410 is configured to receive the RF signal output by the second mixer 1180, amplify the RF signal, and output the amplified RF signal to the antenna 1425 for transmission. It is to be appreciated that the transmitter may include one or more additional components between the second mixer 1180 and the antenna 1425 not shown in FIG. 14.

Figure 15:
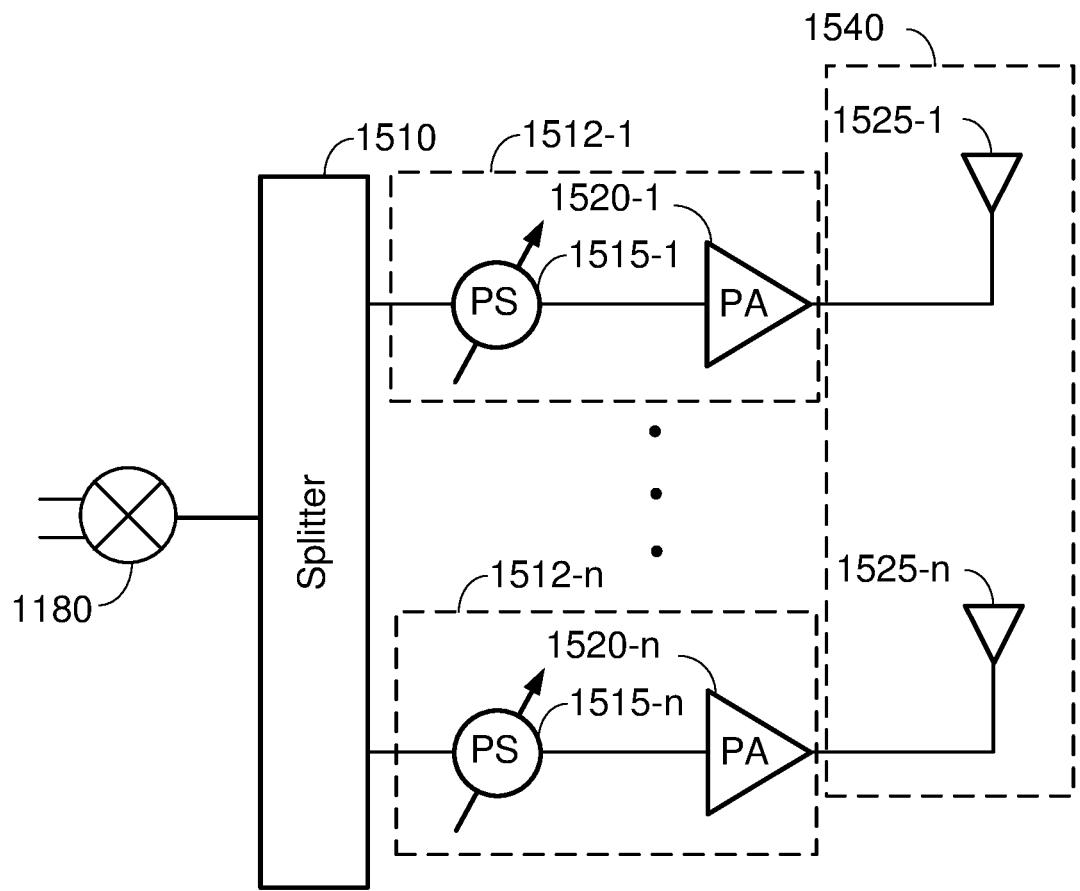
FIG. 15 shows another example of a transmitter including an antenna array according to certain aspects of the present disclosure.

FIG. 15 shows an example in which the transmitter includes a splitter 1510, an antenna array 1540 including multiple antennas 1525-1 to 1525-*n*, and multiple transmit chains 1512-1 to 1512-*n* according to certain aspects. The splitter 1510 has an input coupled to the output of the second mixer 1180 and multiple outputs. Each transmit chain 1512-1 to 1512-*n* is coupled between a respective one of the outputs of the splitter 1510 and a respective one of the antennas 1525-1 to 1525-*n*.

In this example, each of the transmit chains 1512-1 to 1512-*n* includes a respective phase shifter 1515-1 to 1515-*n* and a respective power amplifier 1520-1 to 1520-*n*. In each transmit chain 1512-1 to 1512-*n*, the input of the respective phase shifter 1515-1 to 1515-*n* is coupled to the respective output of the splitter 1510, the input of the respective power amplifier 1520-1 to 1520-*n* is coupled to the output of the respective phase shifter 1515-1 to 1515-*n*, and the output of the respective power amplifier 1520-1 to 1520-*n* is coupled to the respective antenna 1525-1 to 1525-*n*. Each phase shifter 1515-1 to 1515-*n* is configured to shift the phase of the respective RF signal by a respective phase. Each power amplifier 1520-1 to 1520-*n* is configured to amplify the signal from the respective phase shifter 1515-1 to 1515-*n* and output the amplified signal to the respective antenna 1525-1 to 1525-*n* for transmission. In operation, a beamformer (not shown) controls the phases of the phase shifters 1515-1 to 1515-*n* to achieve a desired transmit beam direction for the antenna array 1540 using beamforming.

Figure 16:
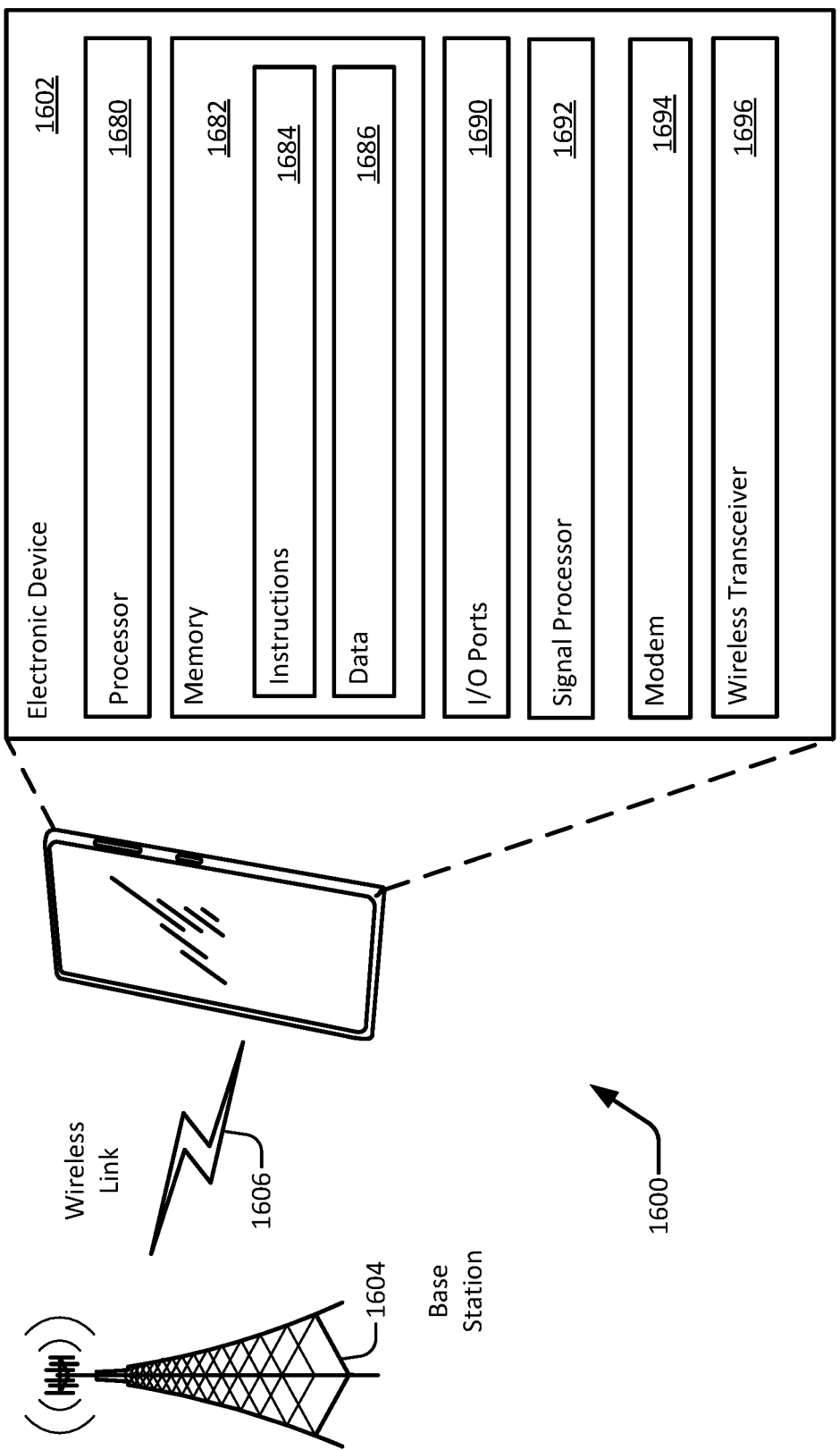
FIG. 16 is a diagram of an environment including an electronic device that includes a transceiver according to certain aspects of the present disclosure.

FIG. 16 is a diagram of an environment 1600 that includes an electronic device 1602 that includes a wireless transceiver 1696. The wireless transceiver 1696 may include the any one or more of the systems illustrated in FIGS. 4A, 4B, 4C, 6, and 11 to 15. In the environment 1600, the electronic device 1602 communicates with a base station 1604 through a wireless link 1606. As shown, the electronic device 1602 is depicted as a smart phone. However, the electronic device 1602 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1604 communicates with the electronic device 1602 via the wireless link 1606, which may be implemented as any suitable type of wireless link. Although depicted as a base station tower of a cellular radio network, the base station 1604 may represent or be implemented as another device, such as a satellite, terrestrial broadcast tower, access point, peer to peer device, mesh network node, fiber optic line, another electronic device generally as described above, and so forth. Hence, the electronic device 1602 may communicate with the base station 1604 or another device via a wired connection, a wireless connection, or a combination thereof. The wireless link 1606 can include a downlink of data or control information communicated from the base station 1604 to the electronic device 1602 and an uplink of other data or control information communicated from the electronic device 1602 to the base station 1604. The wireless link 1606 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1602 includes a processor 1680 and a memory 1682. The memory 1682 may be or form a portion of a computer readable storage medium. The processor 1680 may include any type of processor, such as an application processor or a multi-core processor, that is configured to execute processor-executable instructions (e.g., code) stored by the memory 1682. The memory 1682 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1682 is implemented to store instructions 1684, data 1686, and other information of the electronic device 1602, and thus when configured as or part of a computer readable storage medium, the memory 1682 does not include transitory propagating signals or carrier waves.

The electronic device 1602 may also include input/output (I/O) ports 1690. The I/O ports 1690 enable data exchanges or interaction with other devices, networks, or users or between components of the device.

The electronic device 1602 may further include a signal processor (SP) 1692 (e.g., such as a digital signal processor (DSP)). The signal processor 1692 may function similar to the processor and may be capable executing instructions and/or processing information in conjunction with the memory 1682.

For communication purposes, the electronic device 1602 also includes a modem 1694, the wireless transceiver 1696, and one or more antennas (e.g., the antenna 1225, the antenna 1425, the antenna array 1340 and/or the antenna array 1540). The wireless transceiver 1696 provides connectivity to respective networks and other electronic devices connected therewith using RF wireless signals. The wireless transceiver 1696 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The controller 480 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Figure 17:
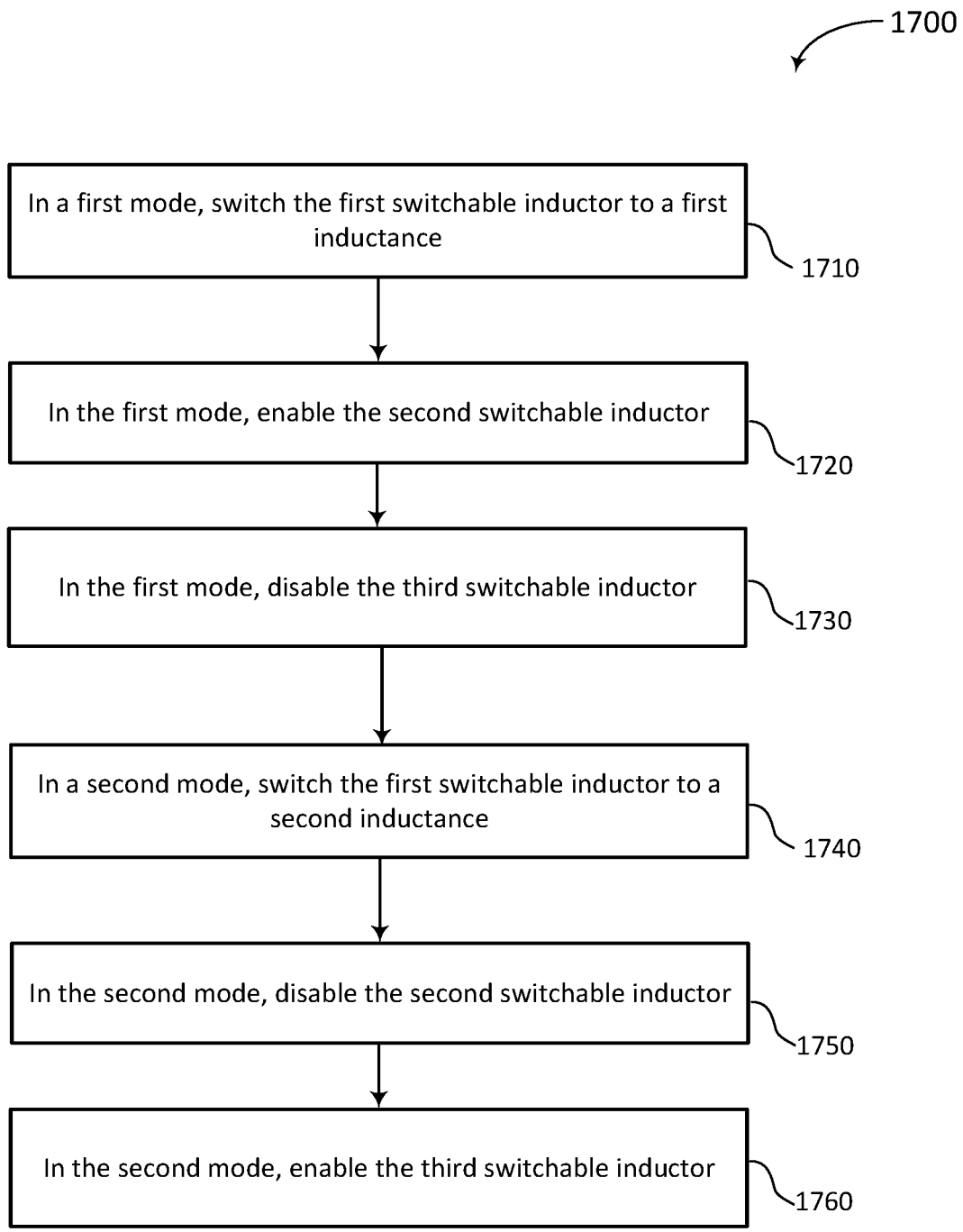
FIG. 17 is a flowchart illustrating an exemplary method for operating an apparatus according to certain aspects of the present disclosure.

FIG. 17 illustrates a method 1700 for operating an apparatus according to certain aspects. The apparatus includes a first amplifier (e.g., first amplifier 120), and a transformer (e.g., switchable transformer 410) including a first switchable inductor (e.g., first switchable inductor 440) coupled to the first amplifier, a second switchable inductor (e.g., second switchable inductor 460) magnetically coupled to the first switchable inductor, and a third switchable inductor (e.g., third switchable inductor 470) magnetically coupled to the first switchable inductor.

At block 1710, in a first mode, the first switchable inductor is switched to a first inductance. For example, the first switchable inductor may be switched to the first inductance by the switching circuit 455.

At block 1720, in the first mode, the second switchable inductor is enabled. For example, the second switchable inductor may be enabled by closing the switch 466. In this example, the switch 466 may be closed by the controller 480.

At block 1730, in the first mode, the third switchable inductor is disabled. For example, the third switchable inductor may be disabled by opening the switch 476. In this example, the switch 476 may be opened by the controller 480.

At block 1740, in a second mode, the first switchable inductor is switched to a second inductance. For example, the first switchable inductor may be switched to the second inductance by the switching circuit 455.

At block 1750, in the second mode, the second switchable inductor is disabled. For example, the second switchable inductor may be disabled by opening the switch 466. In this example, the switch 466 may be opened by the controller 480.

At block 1760, in the second mode, the third switchable inductor is enabled. For example, the third switchable inductor may be enabled by closing the switch 476. In this example, the switch 476 may be closed by the controller 480.

Implementation examples are described in the following numbered clauses:

1. An apparatus, comprising:
   a first amplifier having a first output and a second output;
   a transformer comprising:
     a first switchable inductor coupled between the first output and the second output;
     a first capacitor coupled in parallel with the first switchable inductor;
     a second switchable inductor magnetically coupled to the first switchable inductor;
     a second capacitor coupled in parallel with the second switchable inductor;
     a third switchable inductor magnetically coupled to the first switchable inductor; and
     a third capacitor coupled in parallel with the third switchable inductor.

2. The apparatus of clause 1, further comprising:
   a second amplifier coupled to the second switchable inductor; and
   a third amplifier coupled to the third switchable inductor.

3. The apparatus of clause 2, wherein the second amplifier has a first input and a second input, and the second switchable inductor is coupled between the first input of the second amplifier and the second input of the second amplifier.

4. The apparatus of clause 2 or 3, further comprising a mixer coupled to an output of the second amplifier.

5. The apparatus of clause 4, further comprising a power amplifier coupled to the mixer.

6. The apparatus of any one of clauses 2 to 5, wherein the third amplifier has a first input and a second input, and the third switchable inductor is coupled between the first input of the third amplifier and the second input of the third amplifier.

7. The apparatus of any one of clauses 1 to 6, wherein the first switchable inductor is switchable between a first inductance and a second inductance.

8. The apparatus of clause 7, wherein the second switchable inductor comprises:
   at least one inductor; and
   at least one switch coupled in series with the at least one inductor.

9. The apparatus of clause 8, further comprising a controller configured to:
   in a first mode, switch the first switchable inductor to the first inductance and close the at least one switch; and
   in a second mode, switch the first switchable inductor to the second inductance and open the at least one switch.

10. The apparatus of clause 8 or 9, further comprising a second amplifier having a first input and a second input, wherein the second switchable inductor is coupled between the first input of the second amplifier and the second input of the second amplifier.

11. The apparatus of clause 7, wherein:
   the second switchable inductor comprises:
     at least one first inductor; and
     at least one first switch coupled in series with the at least one first inductor; and
   the third switchable inductor comprises:
     at least one second inductor; and
     at least one second switch coupled in series with the at least one second inductor.

12. The apparatus of clause 11, further comprising a controller configured to:
   in a first mode, switch the first switchable inductor to the first inductance, close the at least one first switch, and open the at least one second switch; and
   in a second mode, switch the first switchable inductor to the second inductance, open the at least one first switch, and close the at least one second switch.

13. The apparatus of clause 11 or 12, further comprising:
   a second amplifier having a first input and a second input, wherein the second switchable inductor is coupled between the first input of the second amplifier and the second input of the second amplifier; and
   a third amplifier having a first input and a second input, wherein the third switchable inductor is coupled between the first input of the third amplifier and the second input of the third amplifier.

14. The apparatus of any one of clauses 1 to 6, wherein the first switchable inductor comprises:
   a first inductor;
   a second inductor;
   a third inductor;
   a fourth inductor; and
   a switching circuit, wherein the switching circuit is configured to:
     couple the first inductor, the second inductor, the third inductor, and the fourth inductor in series between the first output of the first amplifier and the second output of the first amplifier; and
     couple the first inductor and the fourth inductor in series between the first output of the first amplifier and the second output of the first amplifier.

15. The apparatus of clause 14, wherein the second switchable inductor comprises:

a fifth inductor;
a sixth inductor; and
a first switch coupled between the fifth inductor and the sixth inductor.

16. The apparatus of clause 15, further comprising a second amplifier having a first input and a second input, wherein the second switchable inductor is coupled between the first input of the second amplifier and the second input of the second amplifier.

17. The apparatus of clause 15 or 16, wherein the third switchable inductor comprises:
a seventh inductor;
an eighth inductor; and
a second switch coupled between the seventh inductor and the eighth inductor.

18. The apparatus of clause 15 or 17, further comprising:
a second amplifier having a first input and a second input, wherein the second switchable inductor is coupled between the first input of the second amplifier and the second input of the second amplifier; and
a third amplifier having a first input and a second input, wherein the third switchable inductor is coupled between the first input of the third amplifier and the second input of the third amplifier.

19. A method for operating an apparatus, wherein the apparatus includes a first amplifier, and a transformer including a first switchable inductor coupled to the first amplifier, a second switchable inductor magnetically coupled to the first switchable inductor, and a third switchable inductor magnetically coupled to the first switchable inductor, the method comprising:
in a first mode,
switching the first switchable inductor to a first inductance;
enabling the second switchable inductor; and
disabling the third switchable inductor;
in a second mode,
switching the first switchable inductor to a second inductance;
disabling the second switchable inductor; and
enabling the third switchable inductor.

20. The method of clause 19, where the apparatus further comprises:
a second amplifier coupled to the second switchable inductor; and
a third amplifier coupled to the third switchable inductor.

21. The method of clause 20, further comprising:
amplifying a first signal in a frequency band and a second signal in a second frequency band using the first amplifier;
amplifying the first signal in the first frequency band using the second amplifier; and
amplifying the second signal in the second frequency band using the third amplifier.

22. The method of any one of clauses 19 to 21, wherein:
the second switchable inductor includes:
at least one first inductor; and
at least one first switch coupled in series with the at least one first inductor;
enabling the second switchable inductor comprises closing the at least one first switch; and
disabling the second switchable inductor comprises opening the at least one first switch.

23. The method of clause 22, wherein:
the third switchable inductor includes:
at least one second inductor; and
at least one second switch coupled in series with the at least one second inductor;
enabling the third switchable inductor comprises closing the at least one second switch; and
disabling the third switchable inductor comprises opening the at least one second switch.

24. The method of any one of clauses 19 to 21, wherein:
the first switchable inductor comprises:
at least one first inductor;
at least one second inductor; and
at least one switch coupled in parallel with the at least one second inductor;
switching the first switchable inductor to the first inductance comprises opening the at least one switch; and
switching the second switchable inductor to the second inductance comprises closing the at least one switch.

25. The method of any one of clauses 19 to 24, wherein the apparatus further includes:
a first capacitor coupled in parallel with the first switchable inductor;
a second capacitor coupled in parallel with the second switchable inductor; and
a third capacitor coupled in parallel with the third switchable inductor.

26. An apparatus, comprising:
a first amplifier having a first output and a second output;
a transformer comprising:
at least one first inductor;
at least one second inductor, wherein the at least one first inductor and the at least one second inductor are coupled between the first output and the second output of the first amplifier;
at least one first switch coupled in parallel with the at least one second inductor;
at least one third inductor magnetically coupled to the at least one first inductor and the at least one second inductor;
at least one second switch coupled in series with the at least one third inductor;
a second capacitor coupled in parallel with the at least one third inductor and the at least one second switch;
at least one fourth inductor magnetically coupled to the at least one first inductor;
at least one third switch coupled in series with the at least one fourth inductor; and
a third capacitor coupled in parallel with the at least one fourth inductor and the at least one third switch.

27. The apparatus of clause 26, further comprising a second amplifier having a first input and a second input, wherein the at least one third inductor and the at least one second switch are coupled in series between the first input of the second amplifier and the second input of the second amplifier.

28. The apparatus of clause 27, further comprising a third amplifier having a first input and a second input, wherein the at least one fourth inductor and the at least one third switch are coupled in series between the first input of the third amplifier and the second input of the third amplifier.

29. The method of clause 23, wherein:
the first switchable inductor comprises:
at least one third inductor;
at least one fourth inductor; and
at least one third switch coupled in parallel with the at least one fourth inductor;
switching the first switchable inductor to the first inductance comprises opening the at least one third switch; and switching the second switchable inductor to the second inductance comprises closing the at least one third switch.

It is to be appreciated that the present disclosure is not limited to the exemplary terminology used above to describe aspects of the present disclosure. For example, an inductor of a transformer may also be referred to as a winding or another term. Also, it is to be appreciated that an inductor may be referred to as a coil even in cases where the inductor is not physically implemented with a coil. It is also to be appreciated that magnetic coupling may also be referred to as inductive coupling or another term.

It is to be appreciated that any of the switches discussed above may be implemented with one or more n-type field effect transistors (NFETs), one or more p-type field effect transistors (PFETs), a transmission gate, or another type of switch. For an example of a switch implemented with an NFET, the switch is turned on by applying a high voltage (e.g., supply voltage) to the gate of the NFET and turned off by applying a low voltage (e.g., ground) to the gate of the NFET. For an example of a switch implemented with a PFET, the switch is turned off by applying a high voltage (e.g., supply voltage) to the gate of the PFET and turned on by applying a low voltage (e.g., ground) to the gate of the PFET.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. It is also to be appreciated that an "inductor" may include multiple inductors coupled in series. It is also to be appreciated than an "input" may be a single-ended input, a differential input, or one of two inputs of a differential input, and an "output" may be a single-ended output, a differential output, or one of two outputs of a differential output.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first amplifier having a first output and a second output;
   a transformer comprising:
   a first switchable inductor coupled between the first output and the second output;
   a first capacitor coupled in parallel with the first switchable inductor;
   a second switchable inductor magnetically coupled to the first switchable inductor;
   a second capacitor coupled in parallel with the second switchable inductor;
   a third switchable inductor magnetically coupled to the first switchable inductor; and
   a third capacitor coupled in parallel with the third switchable inductor.

2. The apparatus of claim 1, further comprising:
   a second amplifier coupled to the second switchable inductor; and
   a third amplifier coupled to the third switchable inductor.

3. The apparatus of claim 2, wherein the second amplifier has a first input and a second input, and the second switchable inductor is coupled between the first input of the second amplifier and the second input of the second amplifier.

4. The apparatus of claim 2, further comprising a mixer coupled to an output of the second amplifier.

5. The apparatus of claim 4, further comprising a power amplifier coupled to the mixer.

6. The apparatus of claim 3, wherein the third amplifier has a first input and a second input, and the third switchable inductor is coupled between the first input of the third amplifier and the second input of the third amplifier.

7. The apparatus of claim 1, wherein the first switchable inductor is switchable between a first inductance and a second inductance.

8. The apparatus of claim 7, wherein the second switchable inductor comprises:
   at least one inductor; and
   at least one switch coupled in series with the at least one inductor.

9. The apparatus of claim 8, further comprising a controller configured to:
   in a first mode, switch the first switchable inductor to the first inductance and close the at least one switch; and
   in a second mode, switch the first switchable inductor to the second inductance and open the at least one switch.

10. The apparatus of claim 8, further comprising a second amplifier having a first input and a second input, wherein the second switchable inductor is coupled between the first input of the second amplifier and the second input of the second amplifier.

11. The apparatus of claim 7, wherein:
    the second switchable inductor comprises:
      at least one first inductor; and
      at least one first switch coupled in series with the at least one first inductor; and
    the third switchable inductor comprises:
      at least one second inductor; and
      at least one second switch coupled in series with the at least one second inductor.

12. The apparatus of claim 11, further comprising a controller configured to:
    in a first mode, switch the first switchable inductor to the first inductance, close the at least one first switch, and open the at least one second switch; and
    in a second mode, switch the first switchable inductor to the second inductance, open the at least one first switch, and close the at least one second switch.

13. The apparatus of claim 11, further comprising:
    a second amplifier having a first input and a second input, wherein the second switchable inductor is coupled between the first input of the second amplifier and the second input of the second amplifier; and
    a third amplifier having a first input and a second input, wherein the third switchable inductor is coupled between the first input of the third amplifier and the second input of the third amplifier.

14. The apparatus of claim 1, wherein the first switchable inductor comprises:
    a first inductor;
    a second inductor;

a third inductor;
a fourth inductor; and
a switching circuit, wherein the switching circuit is configured to:
couple the first inductor, the second inductor, the third inductor, and the fourth inductor in series between the first output of the first amplifier and the second output of the first amplifier; and
couple the first inductor and the fourth inductor in series between the first output of the first amplifier and the second output of the first amplifier.

15. The apparatus of claim 14, wherein the second switchable inductor comprises:
a fifth inductor;
a sixth inductor; and
a first switch coupled between the fifth inductor and the sixth inductor.

16. The apparatus of claim 15, further comprising a second amplifier having a first input and a second input, wherein the second switchable inductor is coupled between the first input of the second amplifier and the second input of the second amplifier.

17. The apparatus of claim 15, wherein the third switchable inductor comprises:
a seventh inductor;
an eighth inductor; and
a second switch coupled between the seventh inductor and the eighth inductor.

18. The apparatus of claim 17, further comprising:
a second amplifier having a first input and a second input, wherein the second switchable inductor is coupled between the first input of the second amplifier and the second input of the second amplifier; and
a third amplifier having a first input and a second input, wherein the third switchable inductor is coupled between the first input of the third amplifier and the second input of the third amplifier.

19. A method for operating an apparatus, wherein the apparatus includes a first amplifier, and a transformer including a first switchable inductor coupled to the first amplifier, a second switchable inductor magnetically coupled to the first switchable inductor, and a third switchable inductor magnetically coupled to the first switchable inductor, the method comprising:
in a first mode,
switching the first switchable inductor to a first inductance;
enabling the second switchable inductor; and
disabling the third switchable inductor;
in a second mode,
switching the first switchable inductor to a second inductance;
disabling the second switchable inductor; and
enabling the third switchable inductor.

20. The method of claim 19, where the apparatus further comprises:
a second amplifier coupled to the second switchable inductor; and
a third amplifier coupled to the third switchable inductor.

21. The method of claim 20, further comprising:
amplifying a first signal in a first frequency band and a second signal in a second frequency band using the first amplifier;
amplifying the first signal in the first frequency band using the second amplifier; and
amplifying the second signal in the second frequency band using the third amplifier.

22. The method of claim 19, wherein:
the second switchable inductor includes:
at least one first inductor; and
at least one first switch coupled in series with the at least one first inductor;
enabling the second switchable inductor comprises closing the at least one first switch; and
disabling the second switchable inductor comprises opening the at least one first switch.

23. The method of claim 22, wherein:
the third switchable inductor includes:
at least one second inductor; and
at least one second switch coupled in series with the at least one second inductor;
enabling the third switchable inductor comprises closing the at least one second switch; and
disabling the third switchable inductor comprises opening the at least one second switch.

24. The method of claim 19, wherein:
the first switchable inductor comprises:
at least one first inductor;
at least one second inductor; and
at least one switch coupled in parallel with the at least one second inductor;
switching the first switchable inductor to the first inductance comprises opening the at least one switch; and
switching the second switchable inductor to the second inductance comprises closing the at least one switch.

25. The method of claim 19, wherein the apparatus further includes:
a first capacitor coupled in parallel with the first switchable inductor;
a second capacitor coupled in parallel with the second switchable inductor; and
a third capacitor coupled in parallel with the third switchable inductor.

26. An apparatus, comprising:
a first amplifier having a first output and a second output;
a transformer comprising:
at least one first inductor;
at least one second inductor, wherein the at least one first inductor and the at least one second inductor are coupled between the first output and the second output of the first amplifier;
at least one first switch coupled in parallel with the at least one second inductor;
at least one third inductor magnetically coupled to the at least one first inductor and the at least one second inductor;
at least one second switch coupled in series with the at least one third inductor;
a second capacitor coupled in parallel with the at least one third inductor and the at least one second switch;
at least one fourth inductor magnetically coupled to the at least one first inductor;
at least one third switch coupled in series with the at least one fourth inductor; and
a third capacitor coupled in parallel with the at least one fourth inductor and the at least one third switch.

27. The apparatus of claim 26, further comprising a second amplifier having a first input and a second input, wherein the at least one third inductor and the at least one second switch are coupled in series between the first input of the second amplifier and the second input of the second amplifier.

28. The apparatus of claim 27, further comprising a third amplifier having a first input and a second input, wherein the at least one fourth inductor and the at least one third switch are coupled in series between the first input of the third amplifier and the second input of the third amplifier.

* * * * *